US010232582B2

(12) United States Patent
Trulli

(10) Patent No.: US 10,232,582 B2
(45) Date of Patent: *Mar. 19, 2019

(54) ANISOTROPIC THERMAL CONDUIT

(71) Applicant: Raytheon Company, Waltham, MA (US)

(72) Inventor: Susan C. Trulli, Lexington, MA (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/870,155

(22) Filed: Jan. 12, 2018

(65) Prior Publication Data

US 2018/0134000 A1  May 17, 2018

Related U.S. Application Data

(63) Continuation of application No. 14/879,647, filed on Oct. 9, 2015, now Pat. No. 9,889,624.

(51) Int. Cl.

| *F28F 13/12* | (2006.01) |
| *B32B 1/08* | (2006.01) |
| *H05K 7/20* | (2006.01) |
| *B32B 7/12* | (2006.01) |
| *B32B 9/00* | (2006.01) |
| *B32B 9/04* | (2006.01) |
| *F28F 13/00* | (2006.01) |
| *F28F 21/02* | (2006.01) |
| *H01L 23/373* | (2006.01) |

(52) U.S. Cl.
CPC ............... *B32B 1/08* (2013.01); *B32B 7/12* (2013.01); *B32B 9/007* (2013.01); *B32B 9/041* (2013.01); *F28F 13/00* (2013.01); *F28F 21/02* (2013.01); *H01L 23/373* (2013.01); *H01L 23/3736* (2013.01); *H05K 7/2039* (2013.01); *B32B 2255/06* (2013.01); *B32B 2255/205* (2013.01); *B32B 2307/302* (2013.01); *B32B 2457/00* (2013.01); *B32B 2597/00* (2013.01); *F28F 2013/006* (2013.01)

(58) Field of Classification Search
CPC .......... F16L 11/08; B32B 9/007; B32B 9/041; B28F 13/00; B28F 21/02
USPC ..... 138/174, 177, 149, 148; 428/36.9, 36.91
See application file for complete search history.

(56) References Cited

U.S. PATENT DOCUMENTS

| 3,156,091 A | 11/1964 | Kraus |
| 3,980,105 A | 9/1976 | Myskowski |
| 4,057,610 A | 11/1977 | Goettler et al. |
| 4,627,472 A | 12/1986 | Goettler et al. |
| 6,387,462 B1 | 5/2002 | Blain et al. |
| 6,717,813 B1 | 4/2004 | Garner |

(Continued)

FOREIGN PATENT DOCUMENTS

DE    10 2011 078 674 A1    1/2013

OTHER PUBLICATIONS

Notification of Transmittal of the International Search Report and the Written Opinion of the International Searching Authority, or the Declaration, PCT/US2016/054290, dated Jan. 9, 2018, 1 page.

(Continued)

*Primary Examiner* — Patrick F Brinson
(74) *Attorney, Agent, or Firm* — Daly, Crowley, Mofford & Durkee, LLP

(57) ABSTRACT

An anisotropic thermal conduit having an outer cylindrical tube; and an anisotropic thermal material disposed with the outer cylindrical tube.

25 Claims, 23 Drawing Sheets

(56) References Cited

U.S. PATENT DOCUMENTS

| | | |
|---|---|---|
| 2002/0006523 A1 | 1/2002 | Obeshaw |
| 2002/0167800 A1 | 11/2002 | Smalc |
| 2003/0116312 A1 | 6/2003 | Krassowski et al. |
| 2006/0096740 A1 | 5/2006 | Zheng |
| 2007/0053168 A1 | 3/2007 | Sayir et al. |
| 2007/0207186 A1 | 9/2007 | Scanlon et al. |
| 2011/0030924 A1 | 2/2011 | Kawabata et al. |
| 2013/0092354 A1 | 4/2013 | Semenov et al. |
| 2015/0062802 A1 | 3/2015 | Grunow et al. |

OTHER PUBLICATIONS

International Search Report, PCT/US2016/054290, dated Jan. 9, 2017, 4 pages.

Written Opinion of the International Searching Authority, PCT/US2016/054290 dated Jan. 9, 2017, 4 pages.

PCT International Preliminary Report on Patentability dated Apr. 19, 2018 for International Application No. PCT/US2016/054290; 6 Pages.

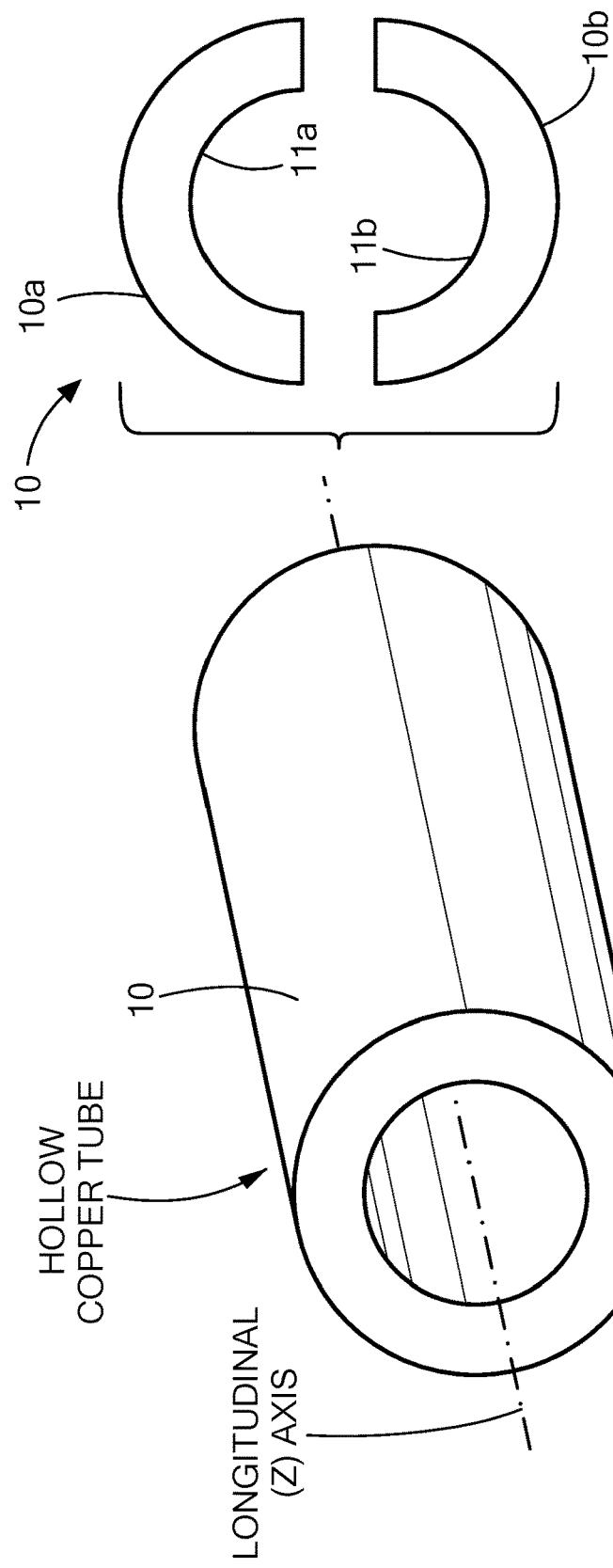

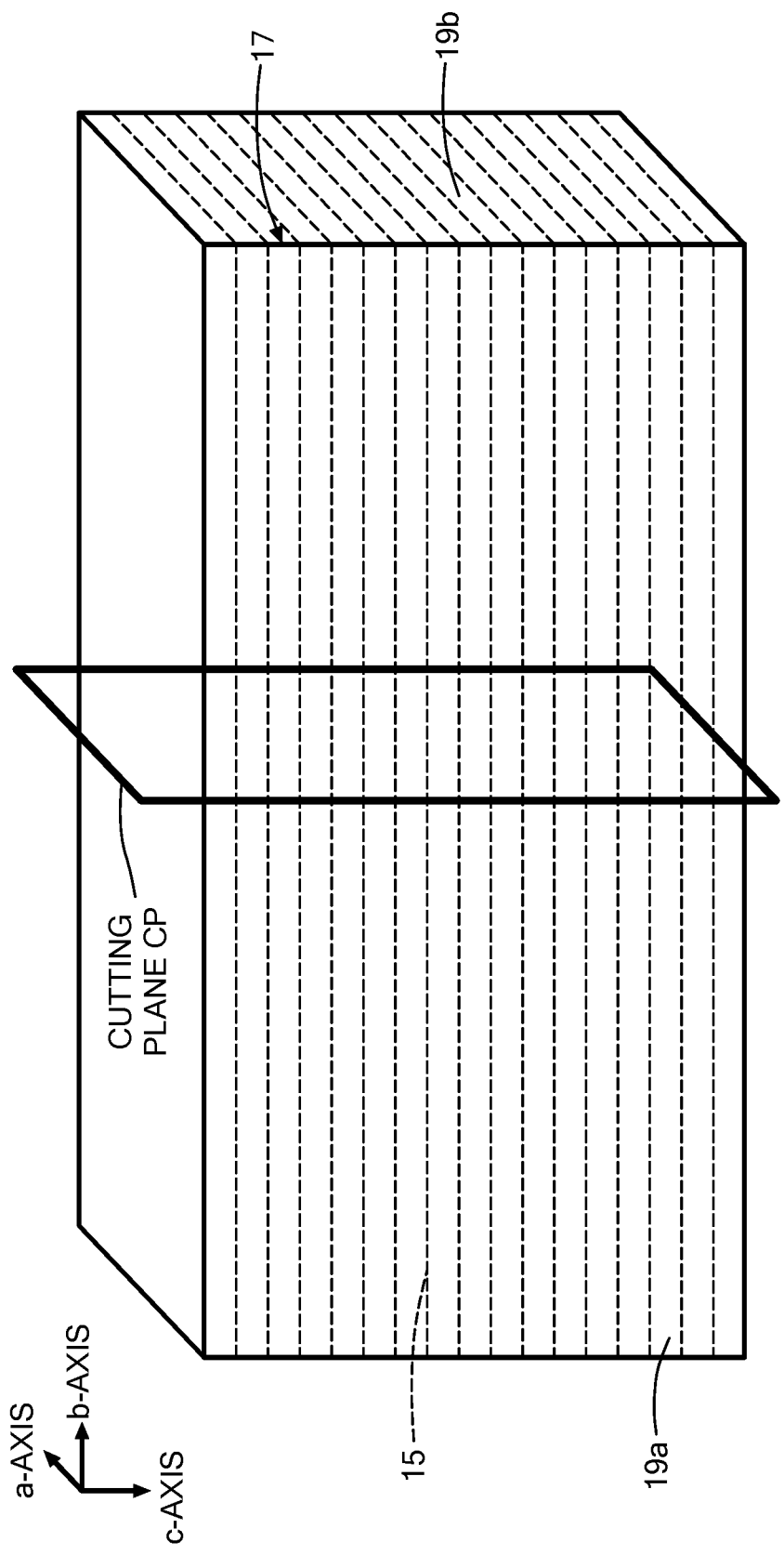

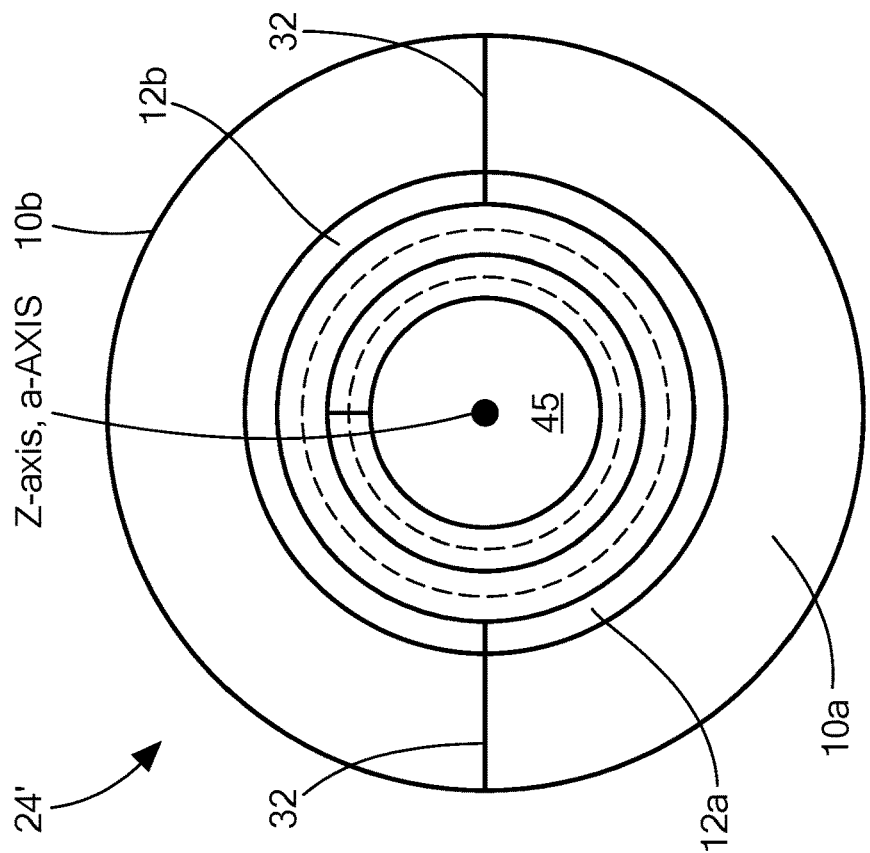
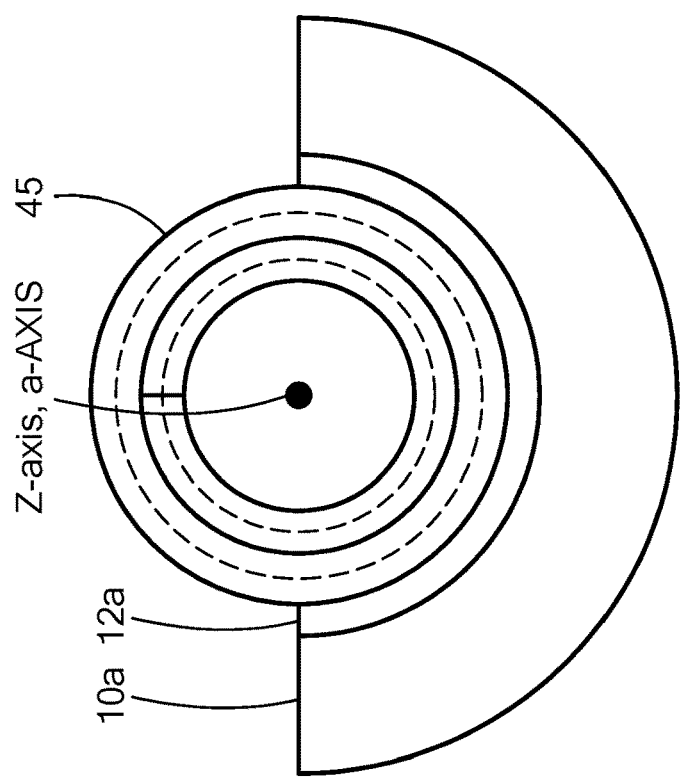
FIG. 5E
FIG. 5D

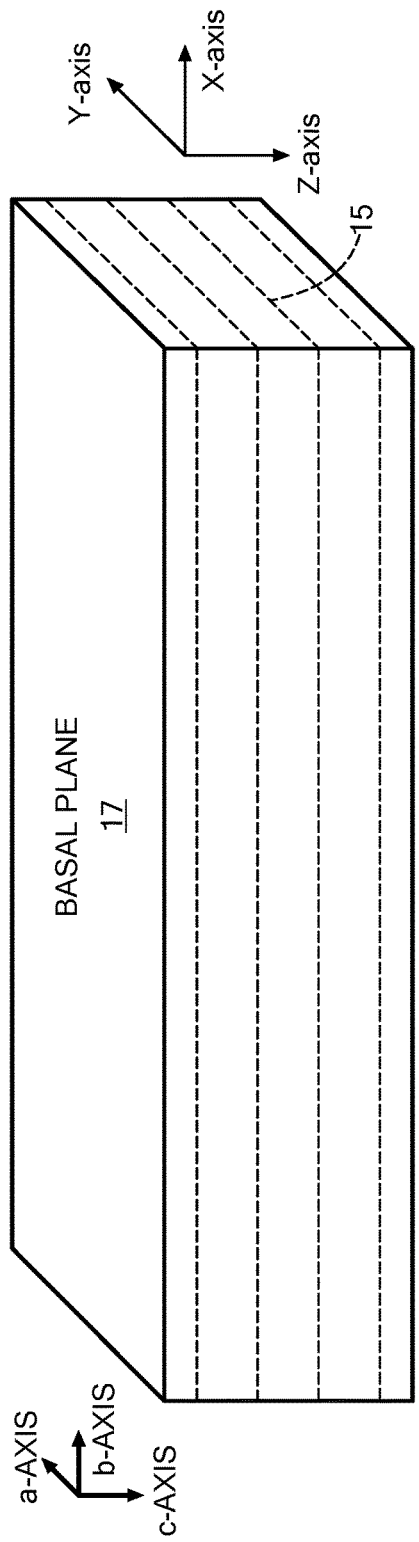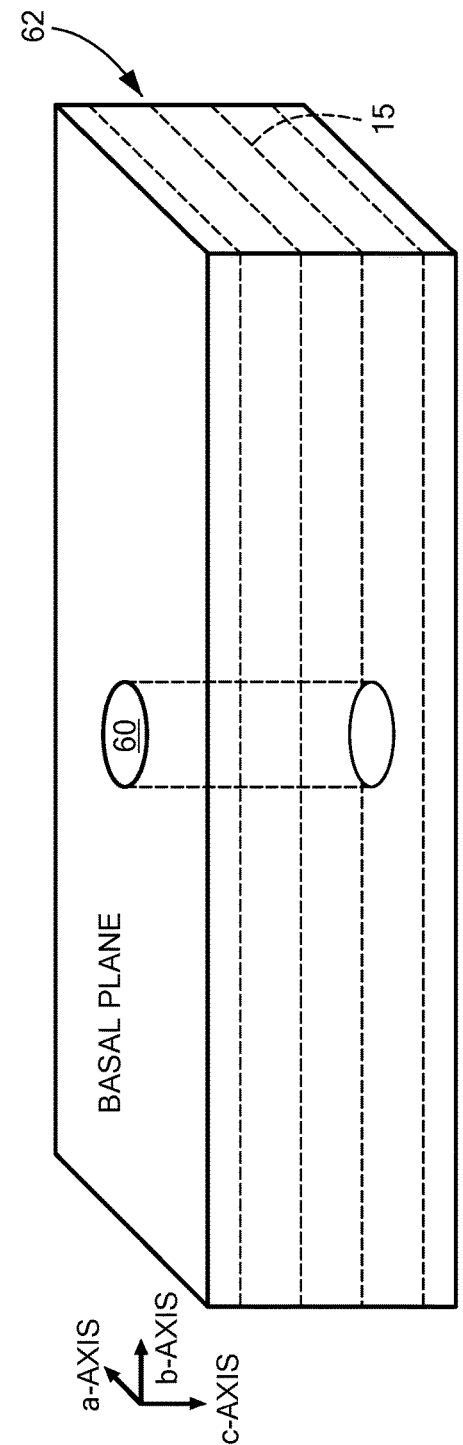
FIG. 6A
FIG. 6B

ANISOTROPIC THERMAL CONDUIT

CROSS REFERENCE TO RELATED APPLICATION

This is a Continuation Application of application Ser. No. 14/879,647, filed Oct. 9, 2015, which application is hereby incorporated herein by reference in its entirety.

TECHNICAL FIELD

This disclosure relates generally to thermal conduits and more particularly to anisotropic thermal conduits.

BACKGROUND

As is known in the art, thermal conduits are used in many applications. One application is in heat spreaders, sometimes also referred to as heat transfer interfaces in extracting heat from a heat source and transporting the exported heat to a heat sink. Further, in order to make a robust, high reliability head spreader, the coefficient of thermal expansion (CTE) between the heat spreader and the heat source should be closely matched and the CTE between the thermal spreader and the heat sink should be closely matched. In electrical applications, for example, these additional interfaces can result in degraded thermal performance and increased electrical parasitics thereby increasing electrical loss, reducing efficiency and/or adding cost and complexity to the system design.

Current method for heat spreader design has been to add intermediate heat spreader transitions between low CTE and typically poorer thermal conductivity materials to high thermally conductive and typically high thermal expansion materials such as copper as the CTE mismatch interface between the high conductivity metals and the low thermally conductive material semiconductor is, in many applications, too great to reliably make a direct transition. This approach adds design complexity, cost, and performance loss due to the additional thermal and electrical interfaces.

As is known in the art, Thermal Pyrolytic Graphite (TPG) material exhibits very anisotropic thermal conductivity such that, within the basal plane, the thermal conductivity can be ~1600 W/m-° K (4× of copper) and perpendicular to the basal plane is ~10 W/m-° K (¹/₄₀ of copper). More particularly, graphites possess anisotropic structures and thus exhibit or possess many properties that are highly directional e.g. thermal and electrical conductivity and fluid diffusion. Still more particularly, graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. A sheet of pyrolytic graphite may be described as having three directional axes; an a-axis and a b-axis which are parallel to the surface of deposition of the basal planes and perpendicular to each other, and a c-axis of which is perpendicular to both the a-axis and the b-axis and to the basal planes. The thermal properties of pyrolytic graphite are strongly affected by its structural anisotropy. Pyrolytic graphite acts as an excellent heat insulator in the c-axis direction (which is along the direction of deposition of the graphite; perpendicular to the plane of the surface upon which the graphite is being deposited) and as a relatively good heat conductor in the planes containing the a-axis and the b-axes.

It should be understood that the term "thermal pyrolytic graphite" ("TPG") may be used interchangeably with "highly oriented pyrolytic graphite" ("HOPG"), or compression annealed pyrolytic graphite ("CAPG").

It is also known in the art that TPG materials have been used as anisotropic thermal conduits in planar heat spreaders as shown in FIG. 1; the basal plane being represented by dotted lines.

SUMMARY

In accordance with the present disclosure, a thermal conduit is provided comprising: an outer cylindrical tube; and an anisotropic thermal material disposed with the outer cylindrical tube.

In one embodiment, the anisotropic thermal material is pyrolytic graphite (TPG).

In one embodiment, the anisotropic thermal material has a greater thermal conductivity along a longitudinal central axis of the tube than the thermal conductivity of the anisotropic thermal material along a direction perpendicular to the longitudinal axis of the tube.

In one embodiment, the anisotropic thermal material has a smaller thermal conductivity along a longitudinal axis of the tube than the thermal conductivity of the anisotropic thermal material along a direction perpendicular to the longitudinal axis of the tube.

In one embodiment, the thermal conductivity of the anisotropic thermal material has conducts heat radially outwardly from the longitudinal axis of the tube.

In one embodiment, the anisotropic thermal material has a basal plane perpendicular to the longitudinal axis of the tube.

In one embodiment, the anisotropic thermal material has a basal plane parallel of the longitudinal axis of the tube.

In one embodiment, the anisotropic thermal material has a basal plane perpendicular extending radially outwardly from the longitudinal axis of the tube.

In one embodiment, the anisotropic thermal material has a smaller thermal conductivity along a direction circumferentially within the tube than the thermal conductivity of the anisotropic thermal material along a direction along the longitudinal axis of the tube.

In one embodiment the anisotropic thermal material is embedded with the tube.

In one embodiment the tube is a thermally conductive metal.

In one embodiment, an inner tube or rod is included and the anisotropic thermal material is disposed between the inner tube or rod and the outer tube.

In one embodiment the outer tube has a circular cross-section.

In one embodiment the inner rod or tube has a circular cross-section.

In one embodiment, the outer tube may be a metal, a ceramic, or a plastic

In one embodiment, the outer tube may be MoCu, WCu, W, Mo, Cu, for example.

In one embodiment, the thermal conduit is bendable.

With such a heat conduit, embedding the anisotropic thermal material inside metal tube walls simultaneously achieves both high and low thermal conductivities in a desired configuration. Such a heat conduit provides intimate transitions from a heat source to a heat sink. Low thermal expansion materials can be used as external mating material while the anisotropic thermal material allows for high thermal conduction in two directions. This tubular structure allows for new packaging concepts that direct the heat and for opportunities for integrating liquid cooling while maintaining a low CTE metal externally eliminating transitions within a within a cooling system or subsystem including microelectronic packaging due to CTE management.

Further, with such anisotropic thermal conduit, because TPG has a density of 2.25 g/cm$^3$, which is ¼ of copper's weight the heat spreader incorporating TPG can also significantly reduce the weight of the heat spreader. The TPG provides the directional thermal conductivity and inner tube or rod and the outer tube provide protection and mechanical strength to the heat spreader. The inner tube can additionally be used as part of fluid cooled system.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 2A-2D are a series of sketches showing a method for fabrication an anisotropic thermal conduit according to the disclosure at various steps in the fabricating thereof; FIG. 2D showing a perspective view of the completed anisotropic thermal conduit in accordance with the disclosure;

FIGS. 3A-3F are a series of sketches showing a method for fabrication an anisotropic thermal member used in the anisotropic thermal conduit of FIG. 2D in accordance with an alternative embodiment of the disclosure;

FIG. 4A showing the conduits between a heat source and a heat sink with their longitudinal axis perpendicular to the surfaces of the heat source and the heat sink; and FIG. 4B showing the conduits between the heat source and the heat sink with their longitudinal axis parallel to the surfaces of the heat source and the heat sink;

FIGS. 5A-5F are a series of sketches showing a method for fabrication an anisotropic thermal conduit in accordance with the disclosure; FIGS. 5B-5E being end views of the conduit; and FIG. 5F showing a perspective view of the completed anisotropic thermal conduit in accordance with the disclosure;

FIGS. 6A-6I are a series of sketches showing a method for fabrication an anisotropic thermal conduit in accordance with another alternative embodiment of the disclosure; FIGS. 6D-6H being end views; and FIG. 6I showing a perspective view of the completed anisotropic thermal conduit in accordance with the disclosure; FIGS. 7A-7C being end views of the conduit; and FIG. 7D showing a perspective view of the completed anisotropic thermal conduit in accordance with the disclosure.

Like reference symbols in the various drawings indicate like elements.

DETAILED DESCRIPTION

Referring now to FIGS. 2A-2D, an outer cylindrical tube 10, here for example, MoCu, WCu, W, Mo, Cu, is provide, as shown. It is noted that the tube 10 is elongated along a central, longitudinal, here Z axis, as shown; it being understood that the tube 10 may have a length greater than, equal to, or less than its diameter.

Next, the tube 10 is cut along the Z axis into two halves 10a, 10b, each having a semi-circular cross section, as shown in FIG. 2B.

Figure 1:
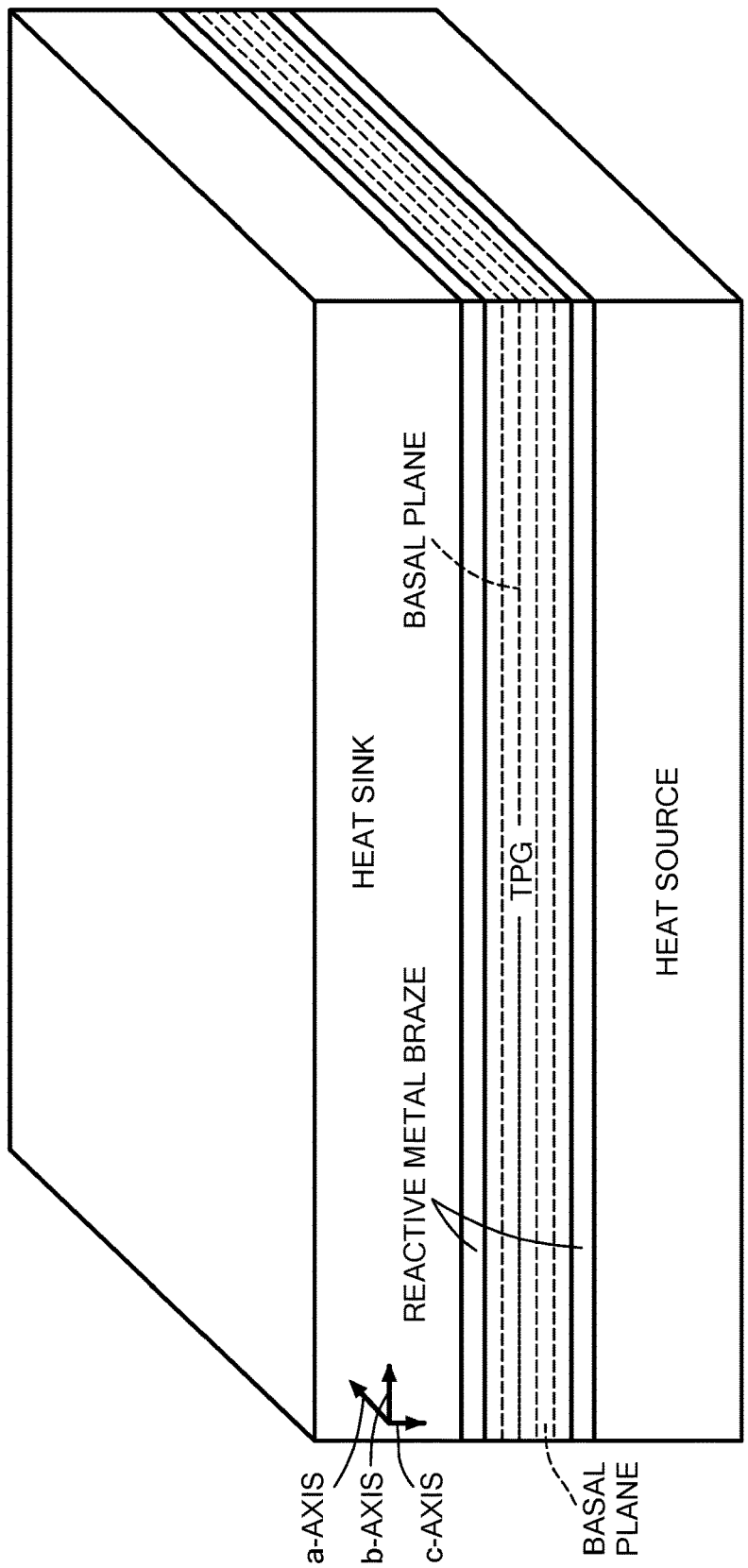
FIG. 1 is a perspective view of an anisotropic thermal material heat spreader according to the PRIOR ART.
Figure 2C:
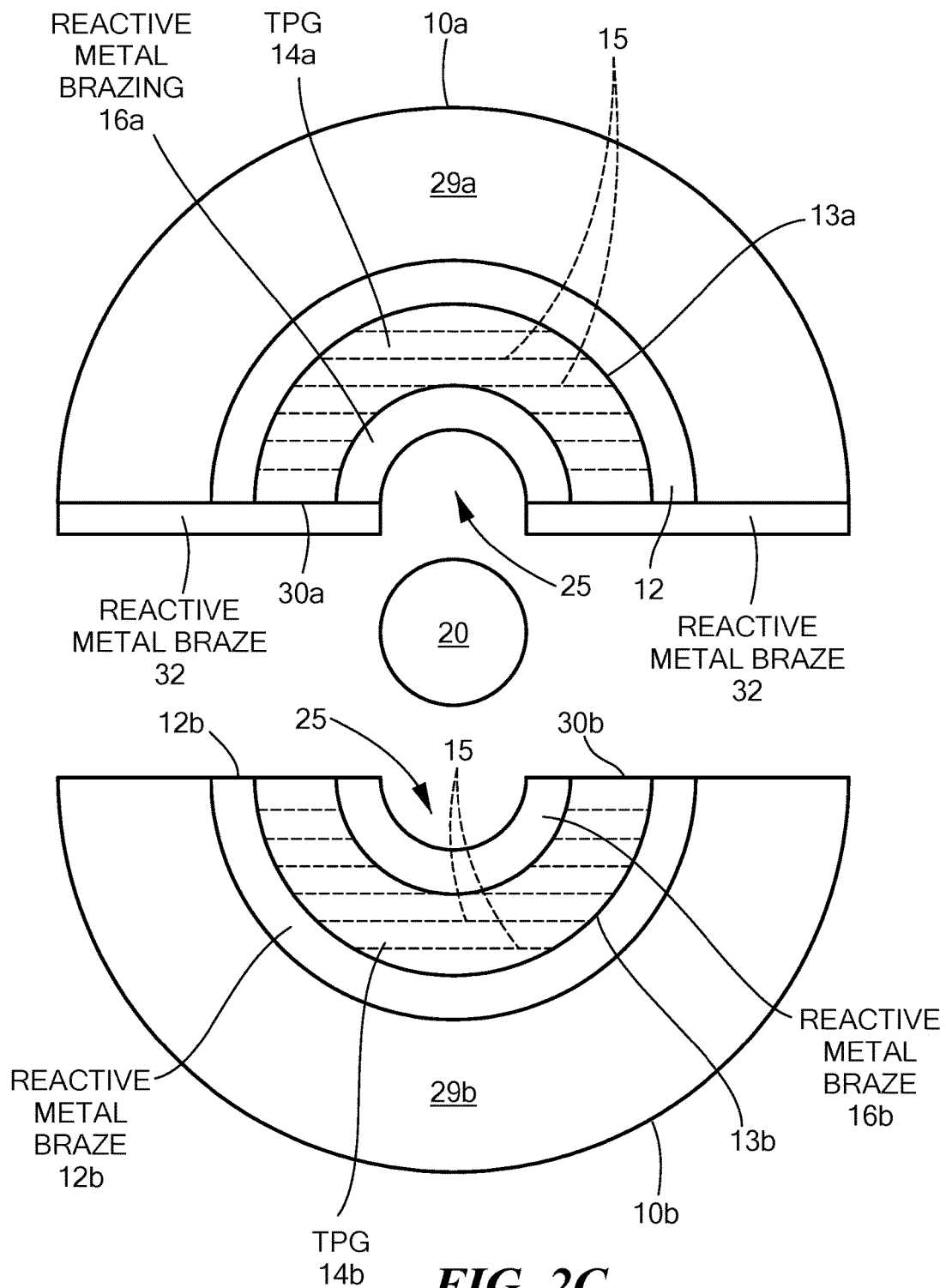

Next, the inner surface of 11a, 11b of each half 10a, 10b, respectively, of the tube 10 are coated with a reactive metal braze alloy 12a, 12b, respectively, as shown in FIG. 2C, here for example using a reactive metal braze alloy such as Indium-Copper-Silver in a conventional brazing or a vacuum brazing process. A reactive metal such as titanium or vanadium may be used as a braze filler or deposited on the surfaces to be brazed.

Next, anisotropic thermal materials, here TPG members 14a, 14b are placed on the reactive metal braze alloy 12a, 12b, respectively, as shown in FIG. 2C. It is noted that in one configuration the basal planes (represented by dotted lines 15) are parallel to the longitudinal axis Z.

More particularly, FIG. 3A-3F show steps used to form the TPG members 14a, 14b. Thus, referring to FIG. 3A, a block 17 of thermal anisotropic material, here for example, TPG, it being understood that other thermal anisotropic materials may be used, is formed using for example, any conventional deposition process. The basal planes 15, having both the a-axis and b-axis of the TPG block 17, are formed perpendicular to the direction of the deposition (along the c-axis of the TPG block 17); the direction of the deposition being indicated by arrows in FIG. 3A. As noted above, the basal planes are represented by the dotted lines 15.

Figure 3A:
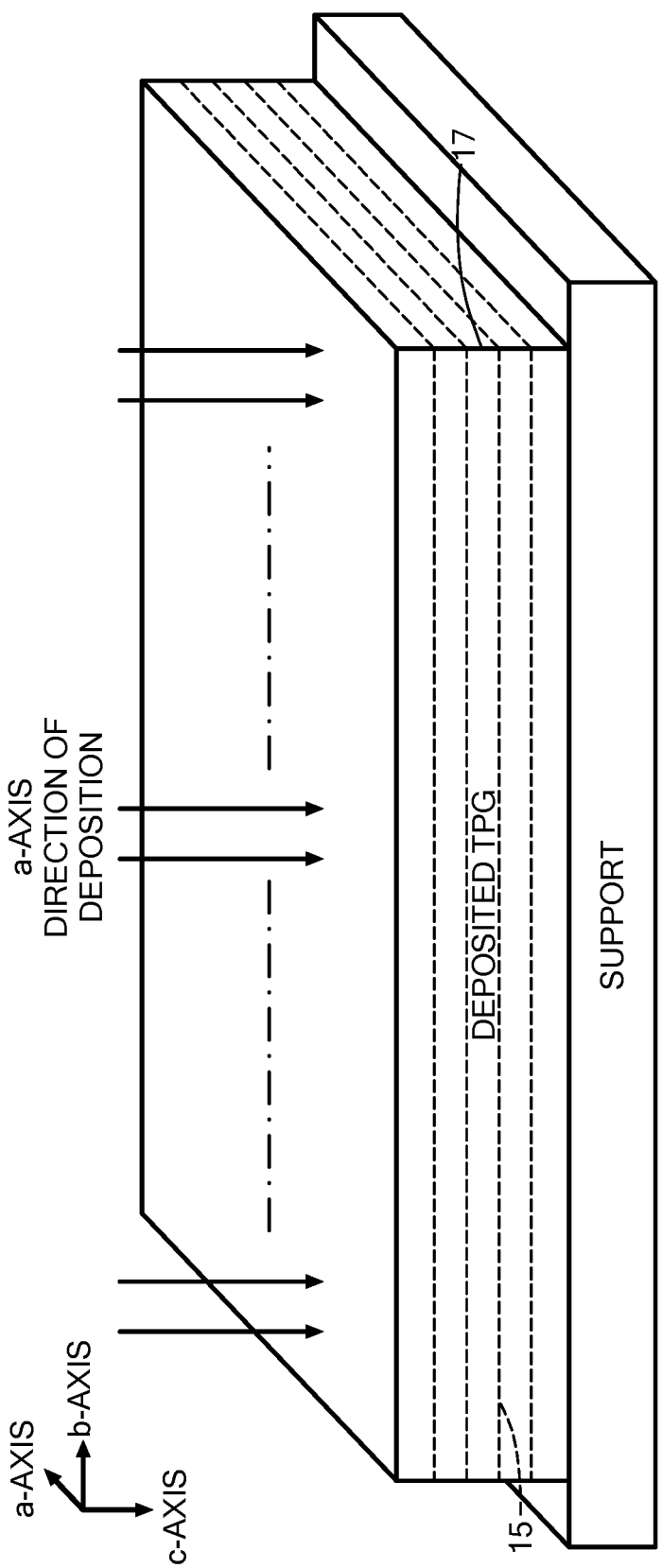
Figure 3C:
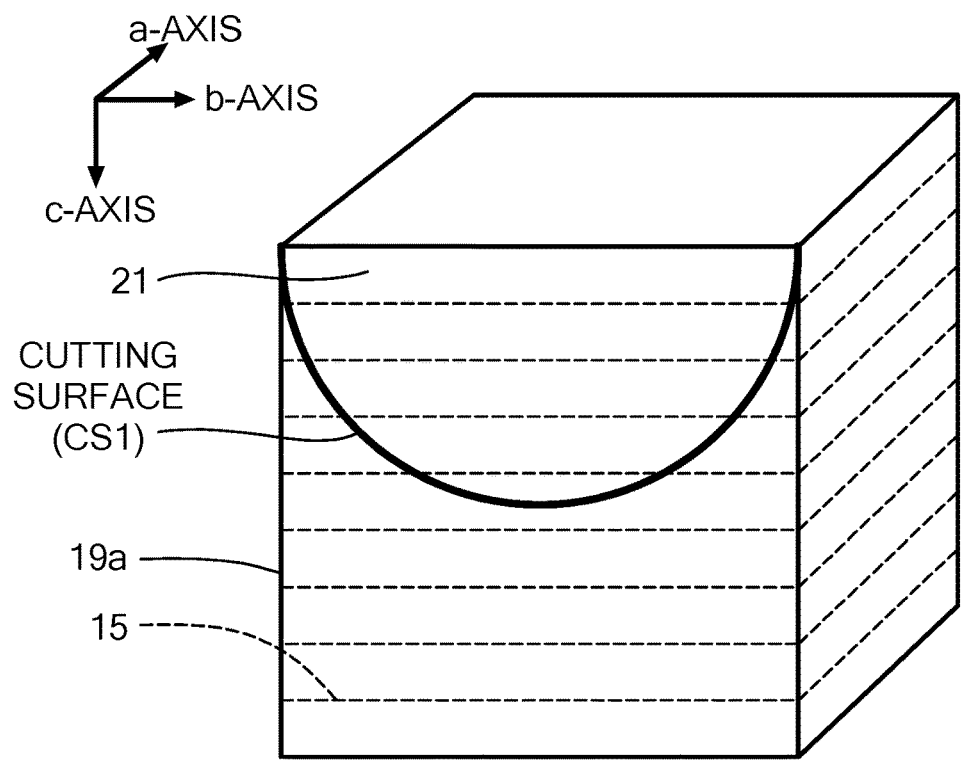
Figure 3D:
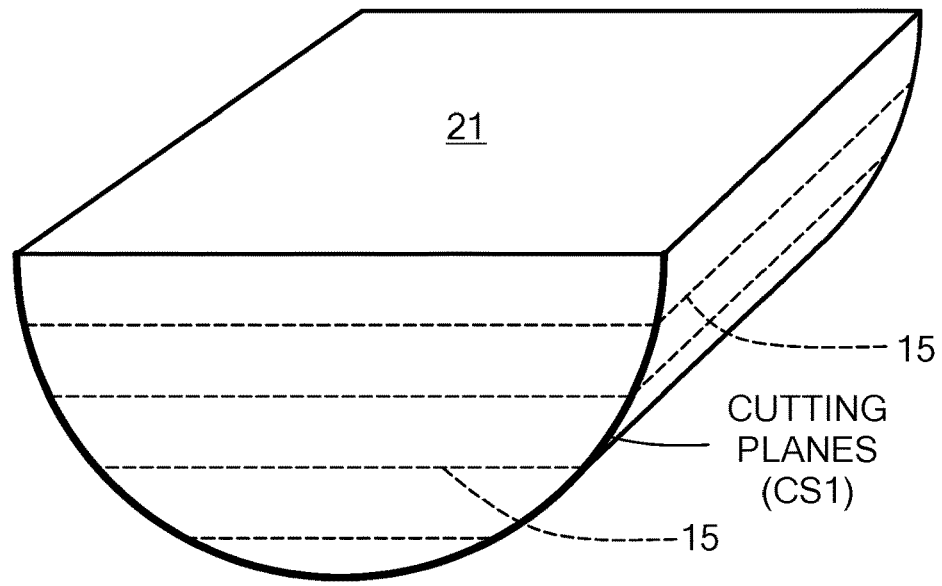
Figure 3E:
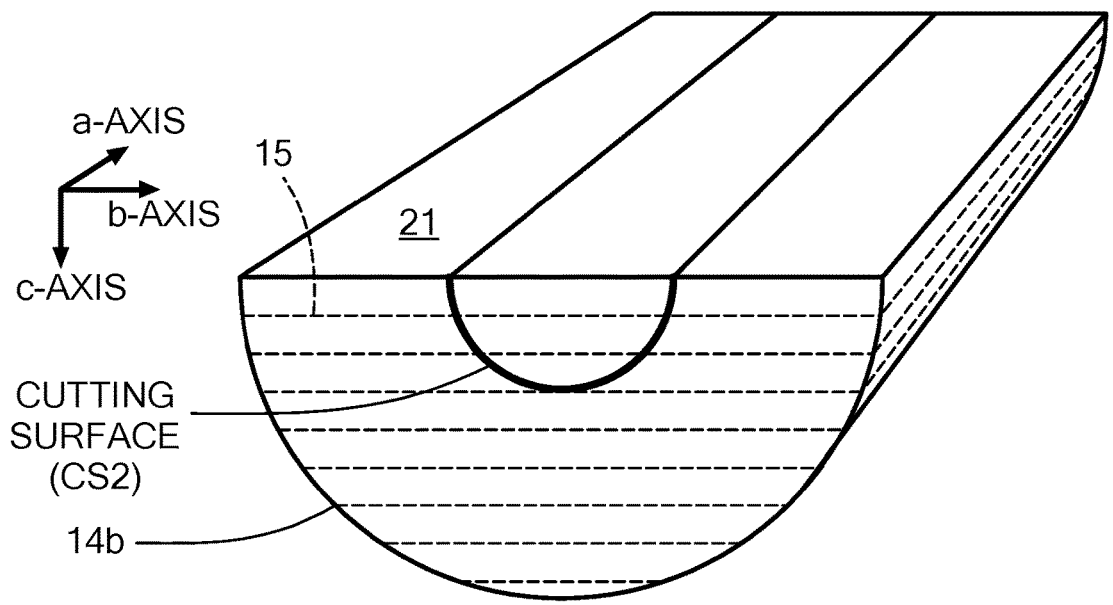
Figure 3F:
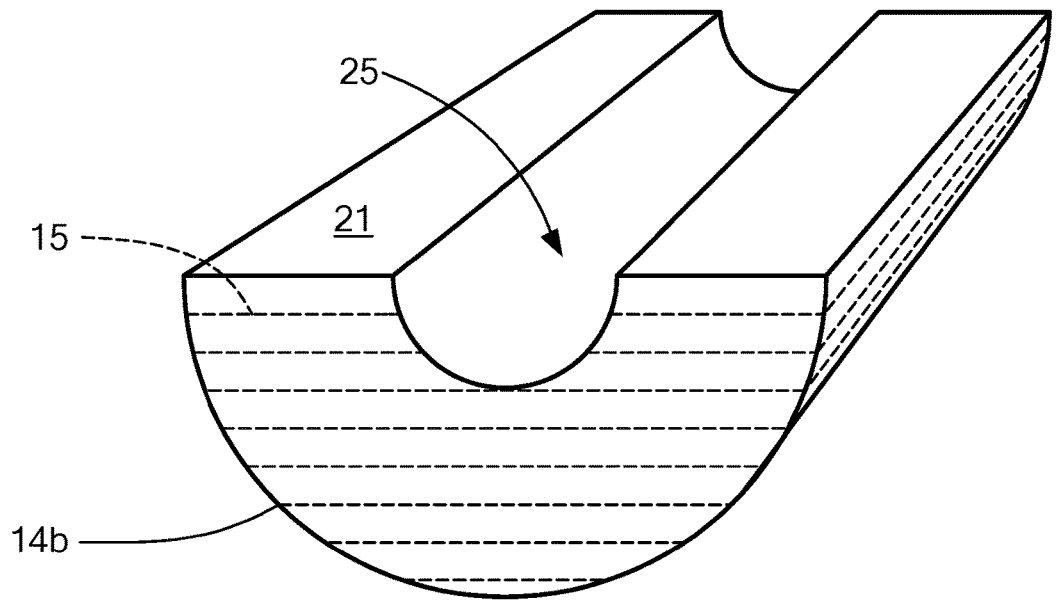

Next, the block 17 is cut along a cutting plane CP a-axis and the c-axis of the TPG material 17 as indicted in FIG. 3B thereby separating the block 17 into two sections 19a, 19b; an exemplary one of the sections 19a, 19b, here section 19a, being shown in FIG. 3C and is positioned with the basal planes 15 orientated as shown. Next, the section 19a is cut along a curved cutting surface CS1 into a TGP member 21 as shown in FIGS. 3C and 3D to form a TPG member 21 shown in FIG. 3D having a cross-section shaped to fit within the inner surface 13a, 13b (FIG. 2B) of a corresponding one of the sections 10a, 10b with the coated reactive metal braze alloy on tube 10. Thus, here with the tube 10 (FIG. 2A), TPG member 14a, 14b (FIG. 2C) has a circular cross section in the c-axis, b-axis plane and the TPG member 21 extends along the a-axis as shown the in FIGS. 3C and 3D. Thus, the a-axis and the b-axis of the TPG material (the basal plane 15) is in the spatial X-Y plane shown in FIGS. 3C and 3D. It should be understood that the inner surface 11a, 11b (FIG. 2B) of the tube 10 is here shown having a circular cross section, the tube 10 may have an oval cross section, a square cross section, rectangular cross section, or any regular or irregular polygon cross section or a cross section along any preferably, continuous closed loop in which case the member 21 would be cut along the closed loop.

Next, an inner region of the member 21 is cut along a curved surface CS2 to form the TPG member 14b (FIG. 2C) having a semi-circular hole 25 through the center of member 21 along a direction parallel to the a-axis, as shown in FIG.

3F. It should be understood that the second section 19b of TPG (FIG. 3B) is processed as described for TPG section 14b producing the pair of shaped TGP members 14a, 14b (FIG. 2C).

Next, and referring again to FIG. 2C, a reactive metal braze alloy 16a, 16b is applied to the exposed surface of each one of the shaped member TGP members 14a, 14b, respectively, as shown, as shown in FIG. 2C to provide an upper structure 29a and a lower structure 29b, as shown in FIG. 2C.

The bottom surface 30a of the upper structure 29a, and/or the upper surface 30b of the lower structure 29b, here for example only the bottom surface 30a of the upper structure 29a is coated with a reactive metal braze alloy 32, such as Indium-Copper-Silver, as shown in FIG. 2C.

Next, an inner rod or tube 20, here a rod, is positioned within the pair of semi-circular holes 25 of the TPG member 14a, 14b along the longitudinal axis Z, as shown in FIG. 2C; the longitudinal axis Z being parallel to the a-axis shown in 3F. The inner tube or rod 20 may be solid or hollow, metal or ceramic, for example, BeO, or it may be an inert glass ceramic that needs heat removed. It is noted that while here the inner tube or rod 20 is shown having the same circular cross section of tube 10, the cross section of the inner tube rod 20 may be different from that of the tube 10 and may have an oval cross section, a square cross section, rectangular cross section, or any regular or irregular polygon cross section or a cross section along any preferably, continuous closed loop.

Figure 2D:
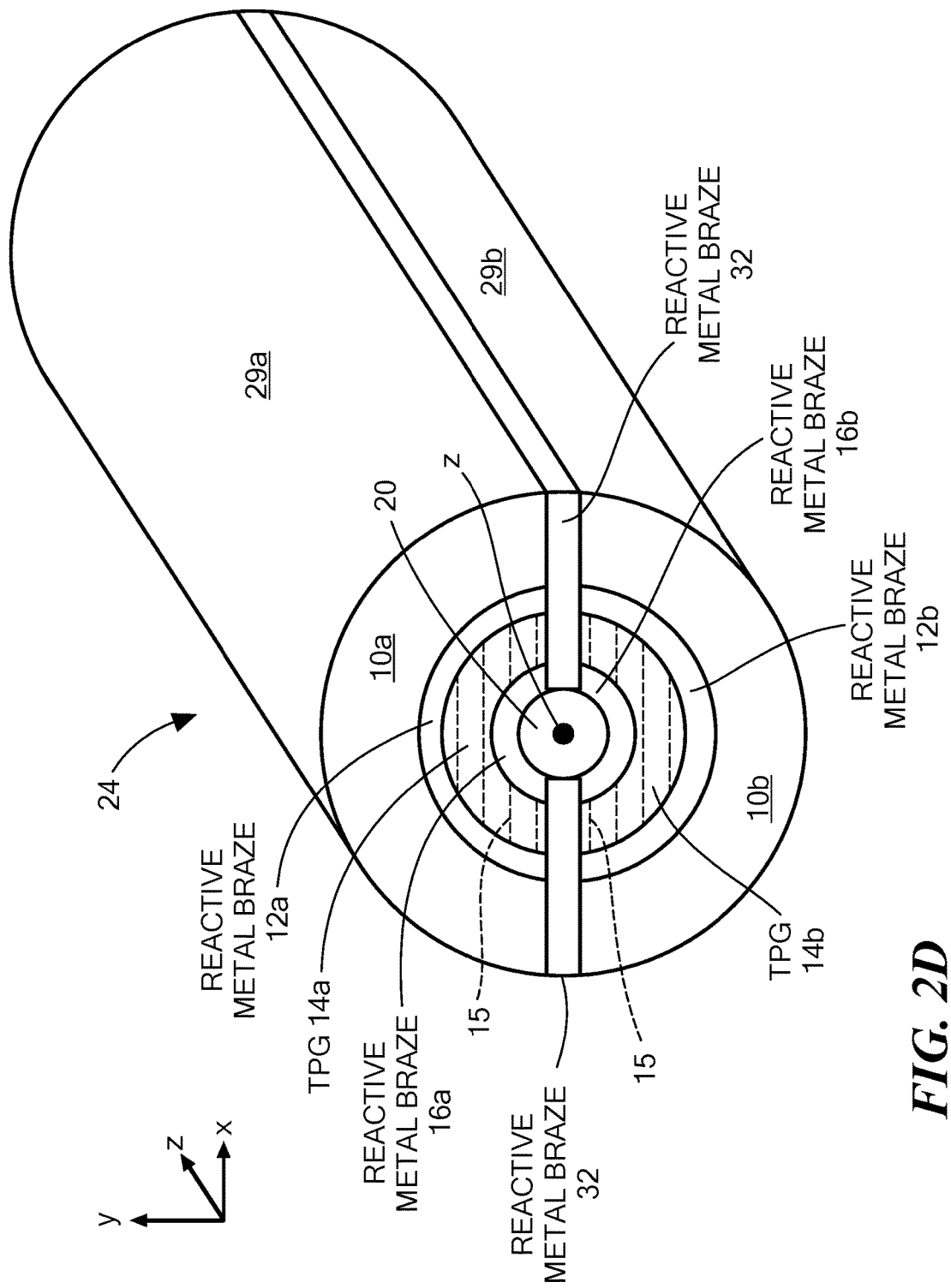

Next, the upper and lower strictures 29a, 29b are brazed together with the inner rod or tube 20 positioned centrally between the upper and lower strictures 29a, 29b within the bonded structure to produce the completed anisotropic thermal conduit 24 shown in FIG. 2D. It should be noted that the reactive metal braze alloy may be done sequentially after each application of braze or may be combined into fewer braze steps. For example, the outer tube 10 may be brazed on for each half 10a, 10b and then another braze to attach the inner tube or rod 20 and combine the halves 10a, 10b or the entire brazing may be done in one braze operation.

Figure 4A:
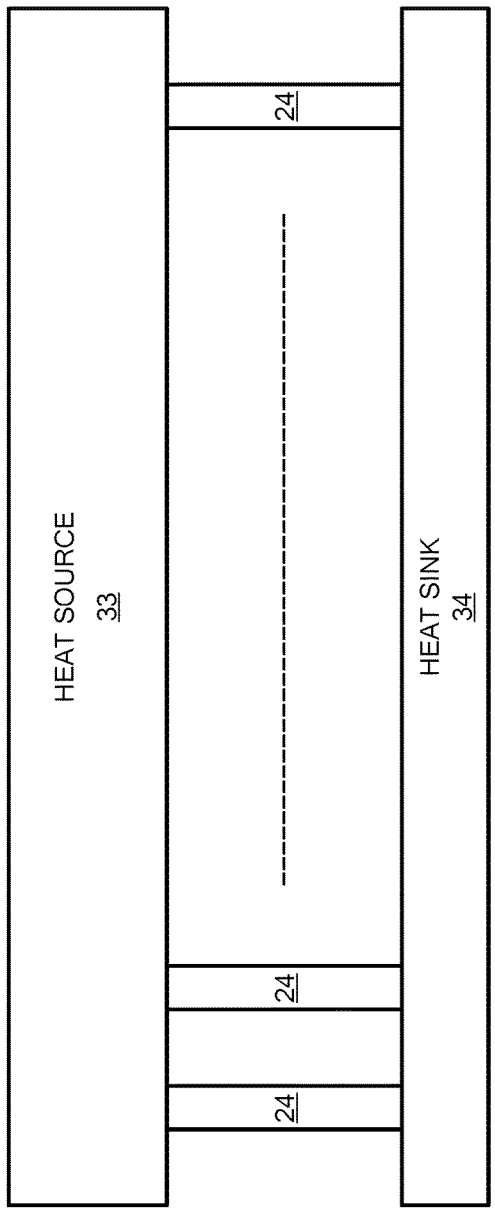
FIGS. 4A and 4B show an exemplary pair of applications for the anisotropic thermal conduit shown in FIG. 2D.
Figure 4B:
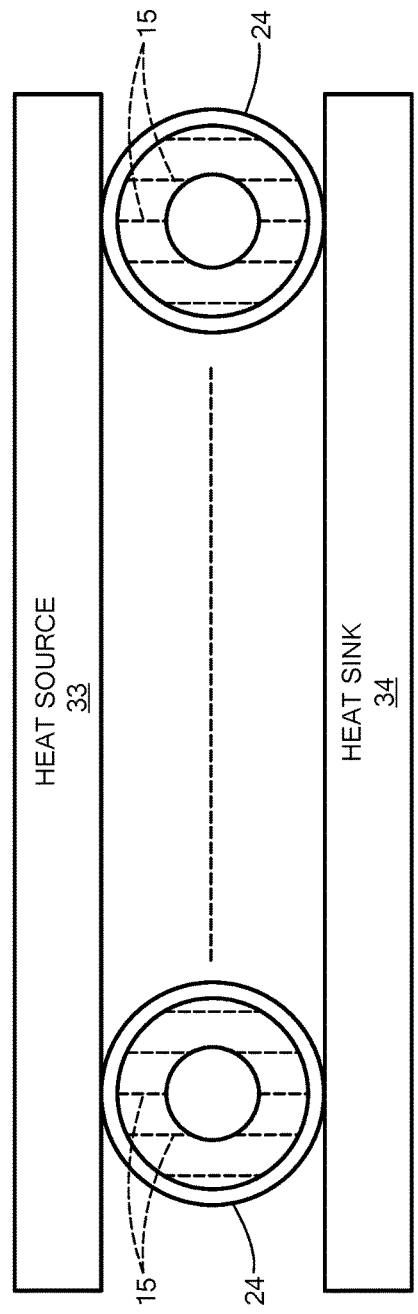

Referring now to FIGS. 4A and 4B, an exemplary pair of many, many applications for the anisotropic thermal conduit 24 is shown. Here, an array of the anisotropic thermal conduits 24 is used as a heat spreader to convey heat from a heat source 33 to a heat sink 34. FIG. 4A shows the conduits 24 between the heat source 33 and the heat sink 34 with their longitudinal axis perpendicular to the surfaces of the heat source 33 and the heat sink 34 and FIG. 4B shows the conduits 24 between the heat source 33 and the heat sink 34 with their longitudinal axis parallel to the surfaces of the heat source 33 and the heat sink 34. It should be understood that the conduit may be oriented relative to the heat source and heat sink in different configurations than that shown in FIGS. 4A and 4B.

Figure 5A:
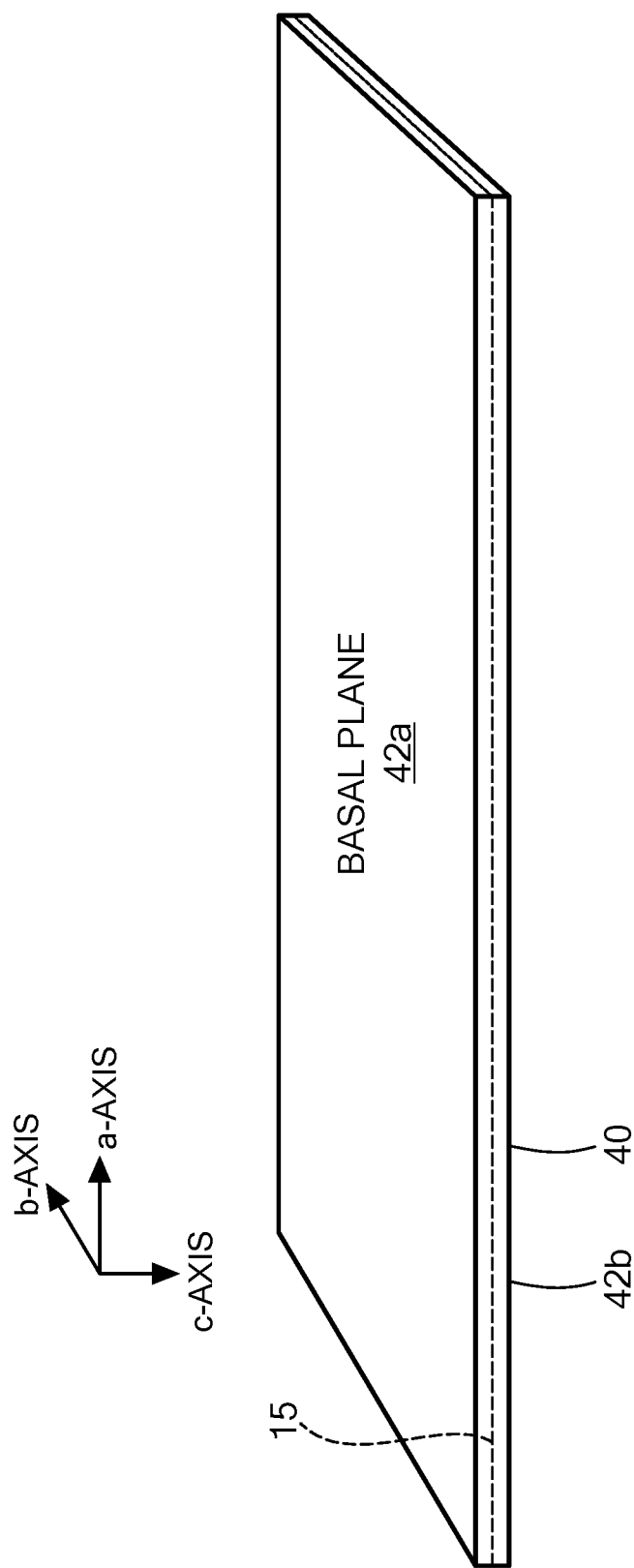
Figure 5C:
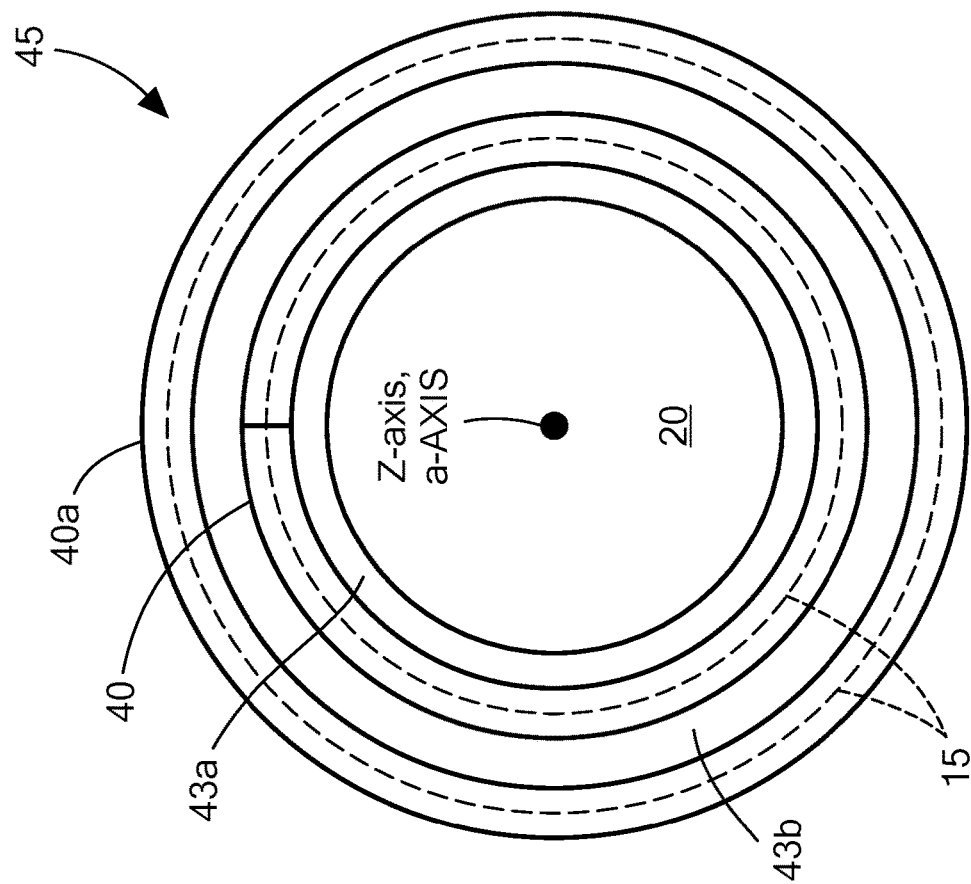
Figure 5B:
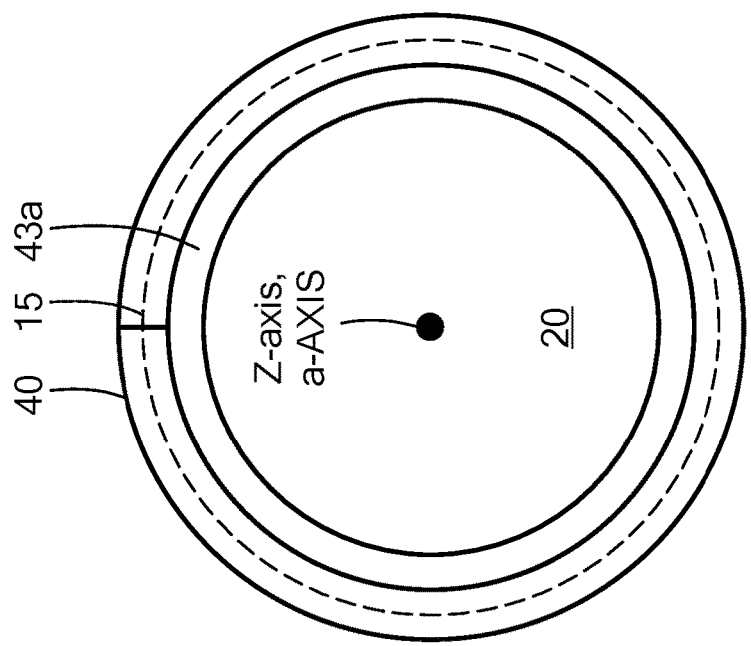
Figure 5F:
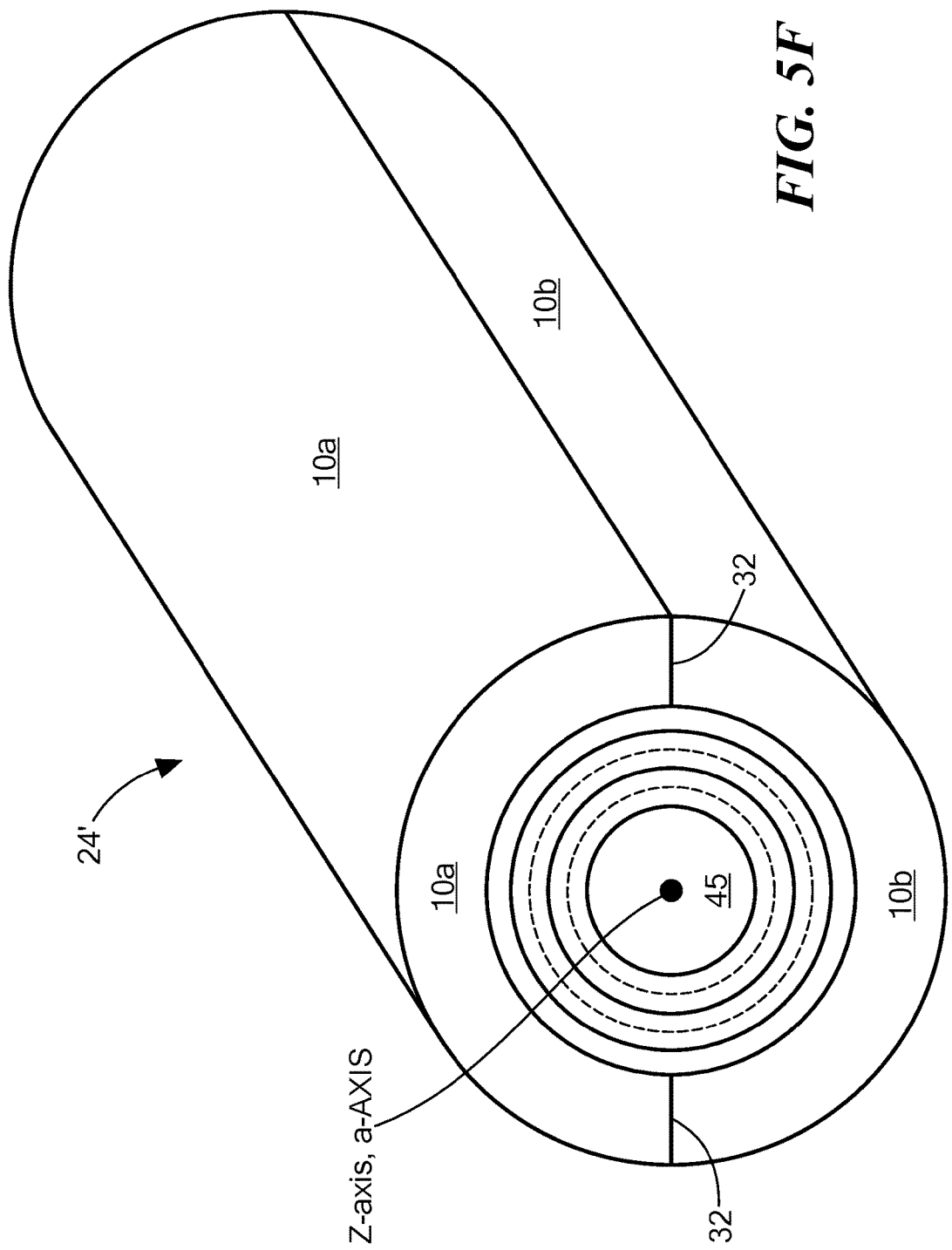

Referring now to FIGS. 5A-5F, another embodiment of forming an anisotropic thermal conduit, here anisotropic thermal conduit 24', is shown. Here, a thin, flexible sheet 40 of the TPG material, here having a thickness of, for example, 0.015 inches is provided, as shown in FIG. 5A. The upper and lower surface 42a, 42b, respectively, is in the basal plane, (the a-axis, b-axis plane) as indicated again by the dotted line 15. A layer of a reactive metal braze alloy 43a is deposited on the outer walls of the inner tube or rod 20, as shown in FIG. 5B. The thin, flexible sheet 40 of the TPG material is wrapped around the layer of the reactive metal braze alloy 43a as shown in FIG. 5B. A second layer of the reactive metal braze alloy 43b is deposited on the outer walls of the TPG layer 40, as shown in FIG. 5C. The process repeats with a second layer of the thin, flexible sheet 40, here indicated as 40a, of the TPG material wrapped around the second reactive metal braze alloy 43b. The process repeats until a structure 45 having predetermined thickness of TPG material is produced. A reactive braze metal alloy 12a, 12b such as described above in connection with FIG. 2C, is placed on each one of two halves 10a, 10b, here half 10a, of the cylindrical tube 10 (FIG. 2A) as shown in FIG. 5D. Next, the structure 45 having predetermined thickness of TPG material, is placed on the metal braze alloy 12a, as shown in FIG. 5D. Next, a reactive metal braze metal alloy 32, such as described above in connection with FIG. 2C, is placed on one of two halves 10a, 10b, here half 10a, of the cylindrical tube 10 (FIG. 2A), and the other half 10b is placed over the structure 45 having predetermined thickness of TPG material to form the assembly shown in FIGS. 5E and 5F. Next, the assembly is processed, as described above in connection with FIGS. 2C and 2D by brazing, to form the thermally anisotropic conduit 24' as shown in FIGS. 5E and 5F. It is noted that the anisotropic thermal conduit 24' has concentric basal planes, represented by the doted lines 15, disposed in concentric circles, circumferentially about the longitudinal, Z-axis, or TPG a-axis, of the conduit 24'.

Figure 6C:
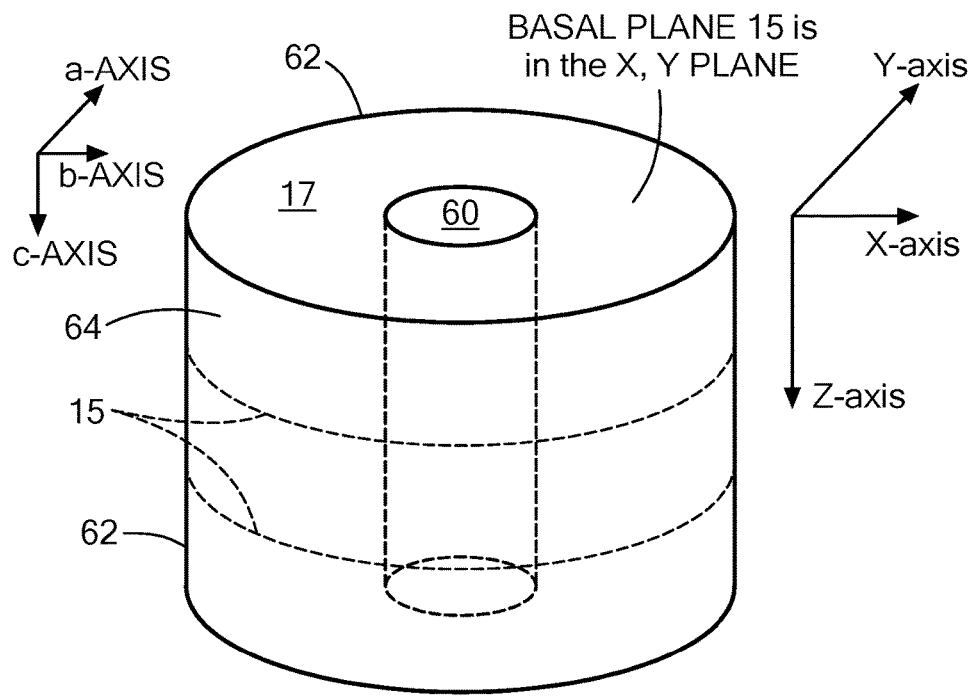
Figure 6D:
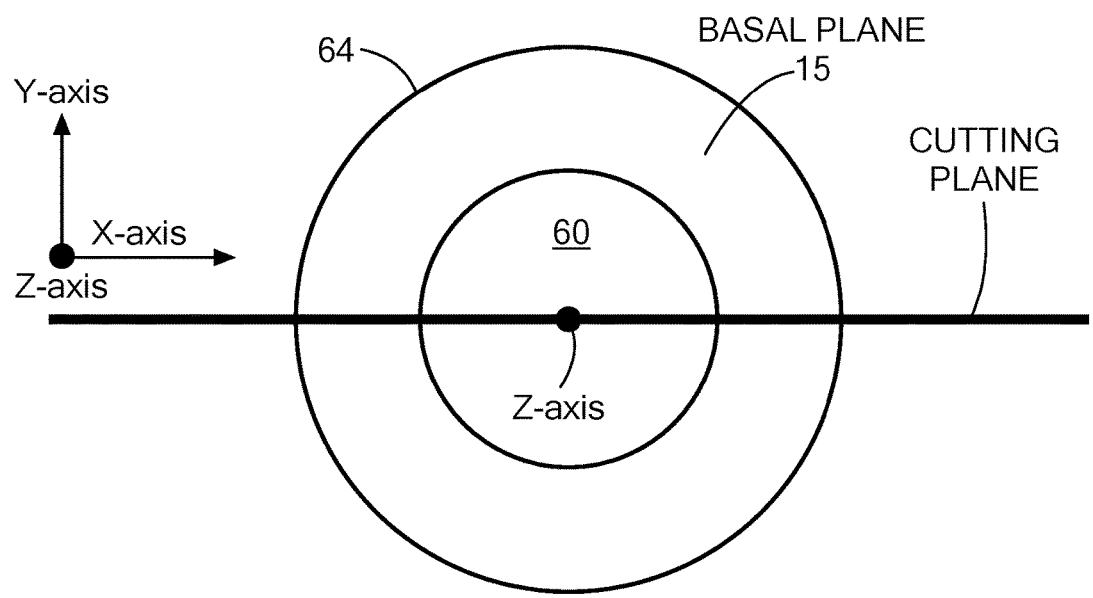
Figure 6E:
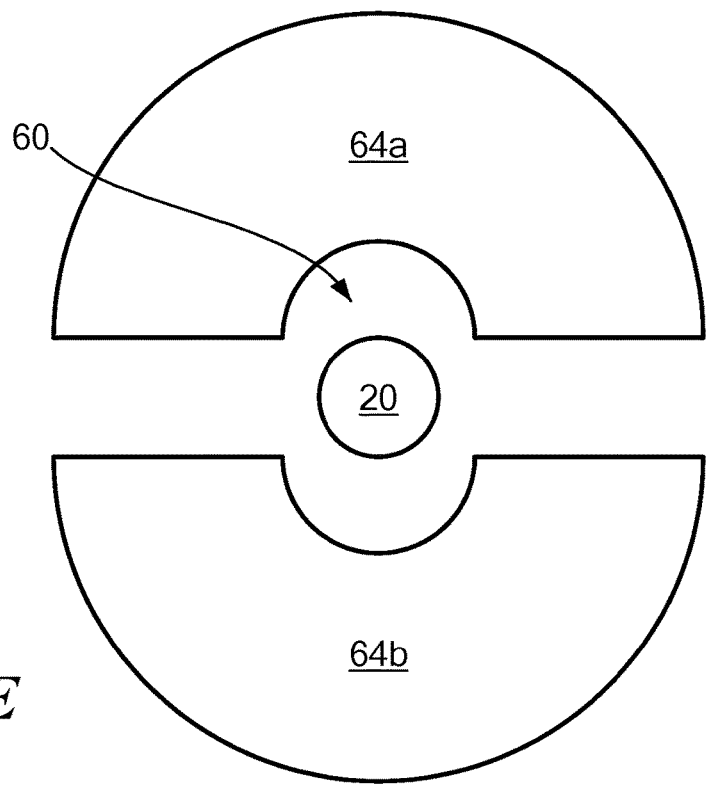
Figure 6F:
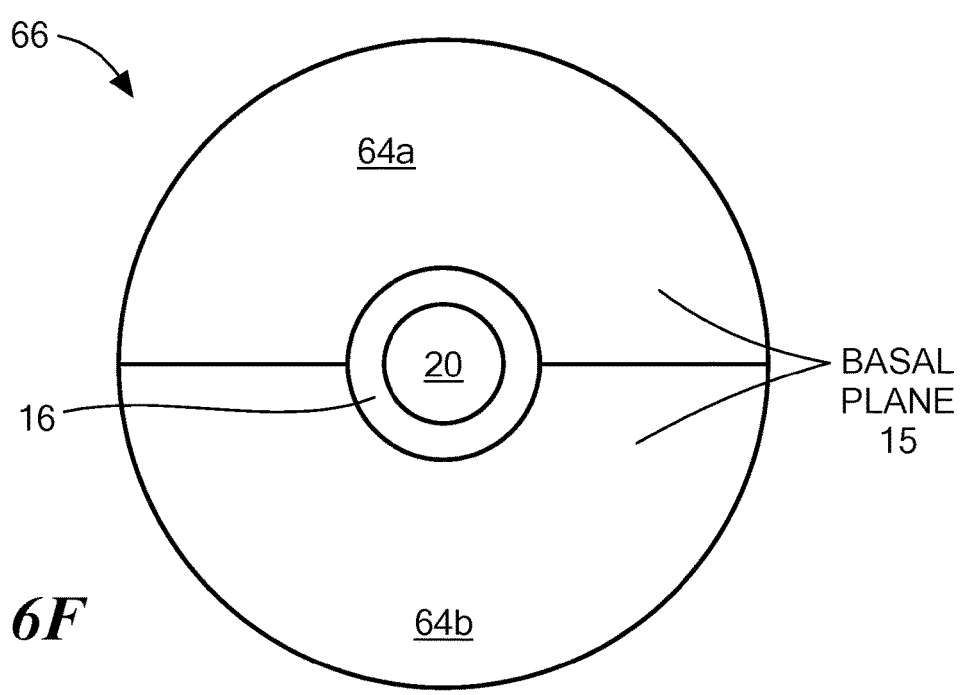
Figure 6G:
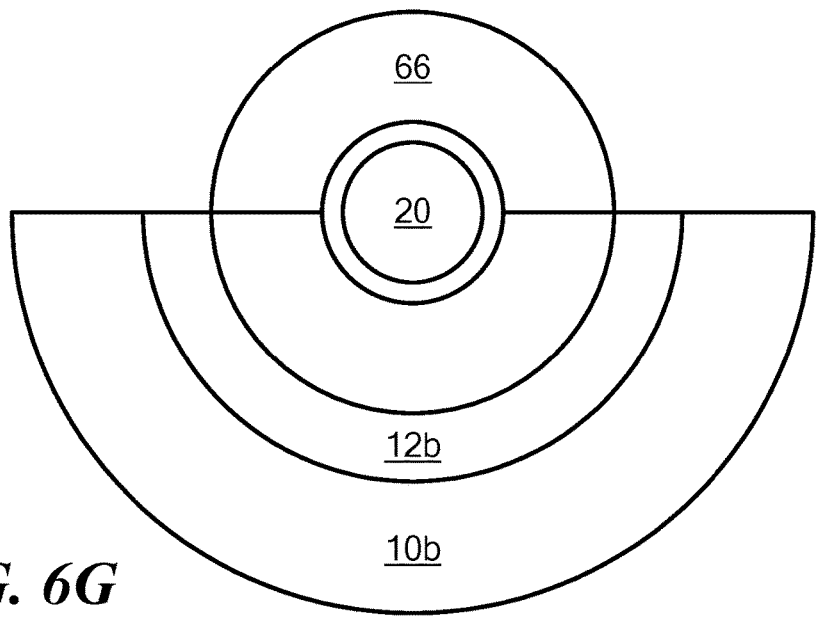
Figure 6H:
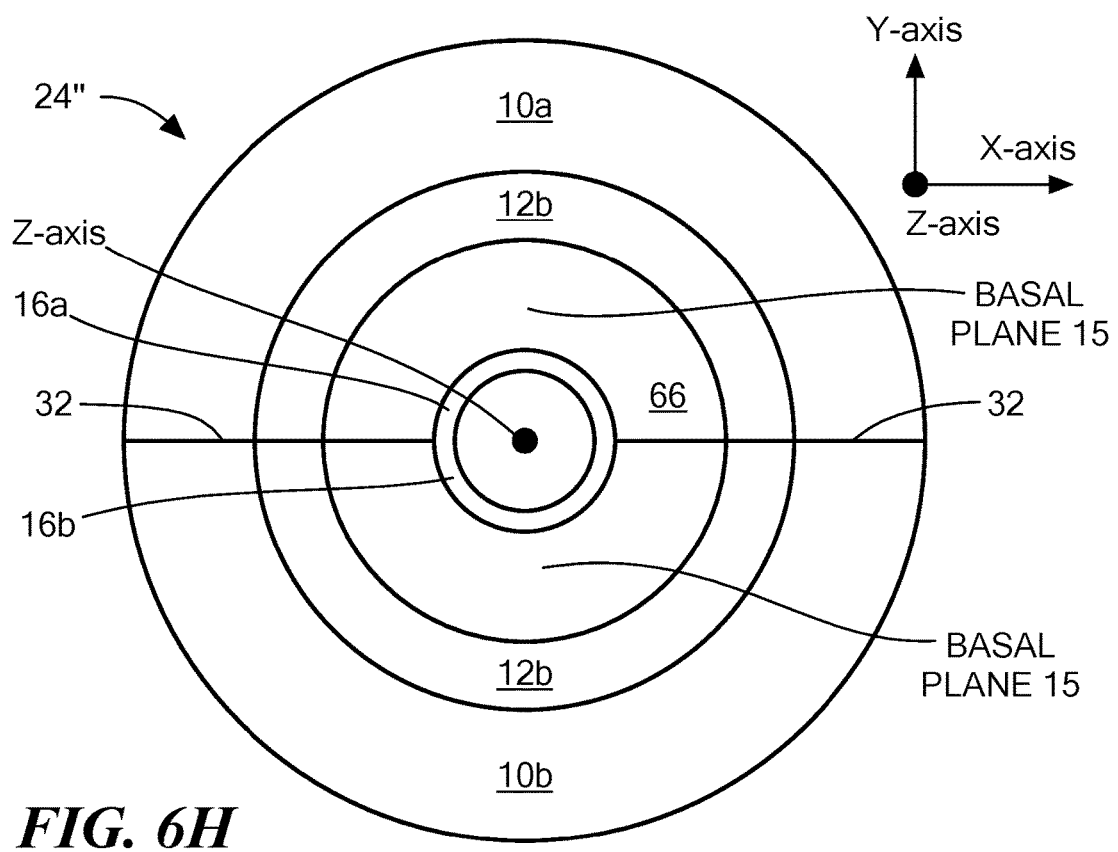
Figure 6I:
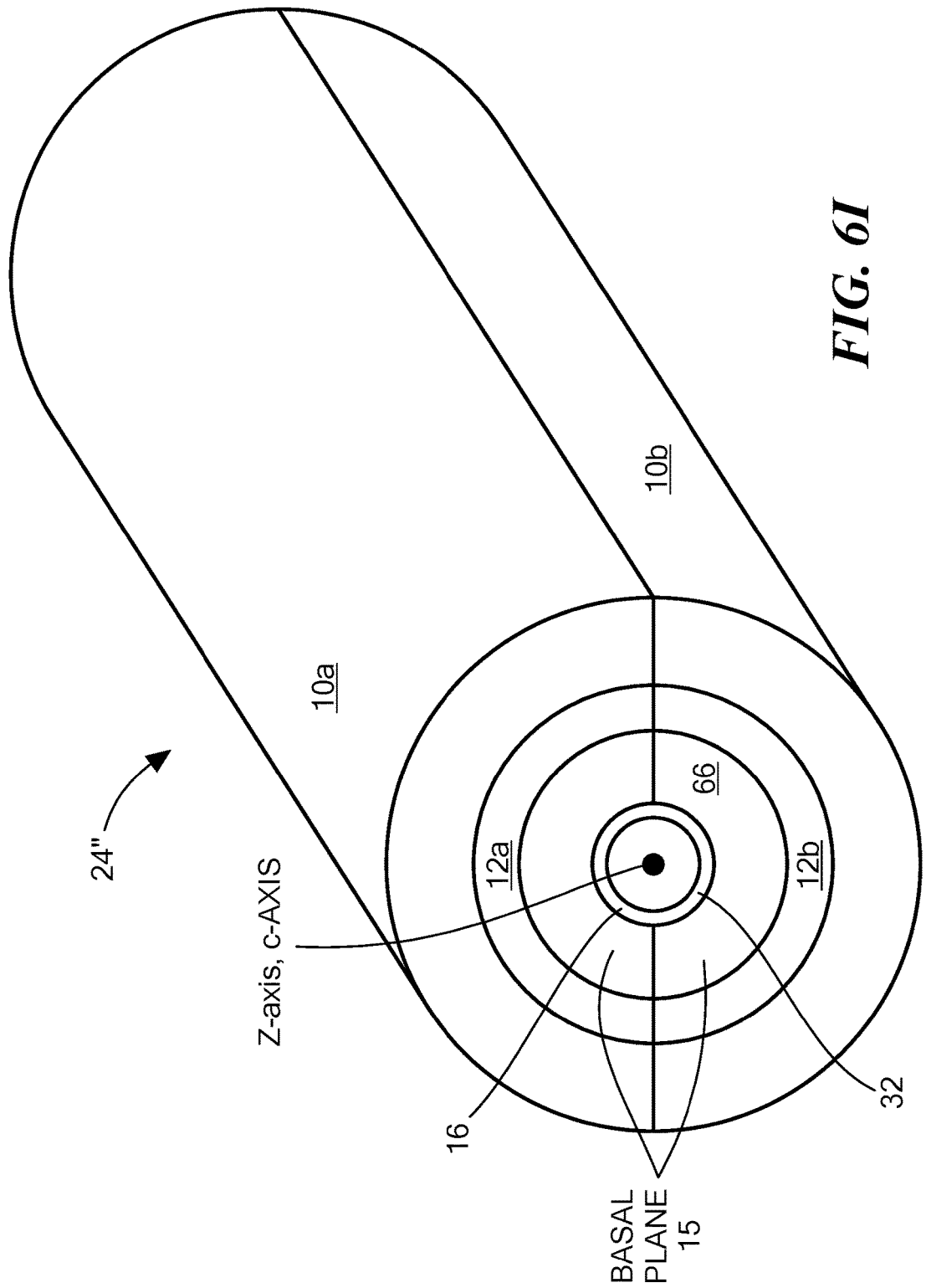

Referring now to FIGS. 6A-6I, another embodiment is shown for producing an anisotropic thermal conduit 24". Thus, referring to FIG. 6A, a block of TPG material 17 is provided. Next, a hole 60 is machined along the spatial Z-axis, corresponding to the c-axis of the TPG material (perpendicular to the upper and lower surface of the block 17; that is, perpendicular to the basal plane (which is in the spatial X-Y plane corresponding to the plane of the TPG material having the a-axis and the b-axis) represented by dotted line 15, to produce the structure 62 shown in FIG. 6B. Next, the structure 62 shown in FIG. 6B has its outer surface machined to form a rounded, donut shaped structure 64, as shown in FIGS. 6C and 6D. Next, the structure 64 is cut in half to produce an upper section 64a and a lower section 64b, as shown in FIG. 6E. Reactive braze material 16 is applied to inner tube or rod 20 and then placed in hole 60 formed between the upper and lower sections to provide a structure 66 (FIG. 6F). A reactive metal braze alloy 12b, such as described above in connection with FIG. 2C, is placed on one of two halves 10a, 10b, here half 10b, of the cylindrical tube 10 (FIG. 2A) as shown in FIG. 6G. Next, the structure 66 having the inner tube or rod 20 and the donut shaped TPG, is placed on the reactive braze metal alloy 12b, as shown in FIG. 6G. Next, a reactive metal braze alloy 12a, such as described above in connection with FIG. 2C, is placed on the other one of two halves 10a, 10b, here half 10a, of the cylindrical tube 10 (FIG. 2A). The other half 10a is placed over the structure 66 having a reactive metal braze alloy coated, donut shaped TPG, to form the assembly shown in FIGS. 6H and 6I. Next, the assembly shown in FIG. 6H is processed, as described above in connection with FIGS. 2C and 2D by brazing, to form the thermally anisotropic conduit 24". It is noted that the anisotropic thermal conduit 66 has basal planes, perpendicular to the longitudinal, Z-axis of the conduit 24".

Referring now to FIGS. 7A-7D, a plurality of the anisotropic thermally conductive sheets 40, here for example TPG material as described above in connection with FIG. 5A, are arranged edgewise in a regularly spaced, truncated semi-circular arrangement as shown and are bonded together with reactive metal braze alloy 12a to provide a structure 70a. The basal plane 15 of the plurality of sheets 40 thus extend radially outward from the spatial Z-axis, as indicated. The, a-Axis, b-Axis and the c-Axis for an exemplary one of the sheets 40 is shown; the a-Axis being into the plane of the paper. The inner edges 73 of the sheets 40 form a semi-circular region 72a, as shown.

Figure 7A:
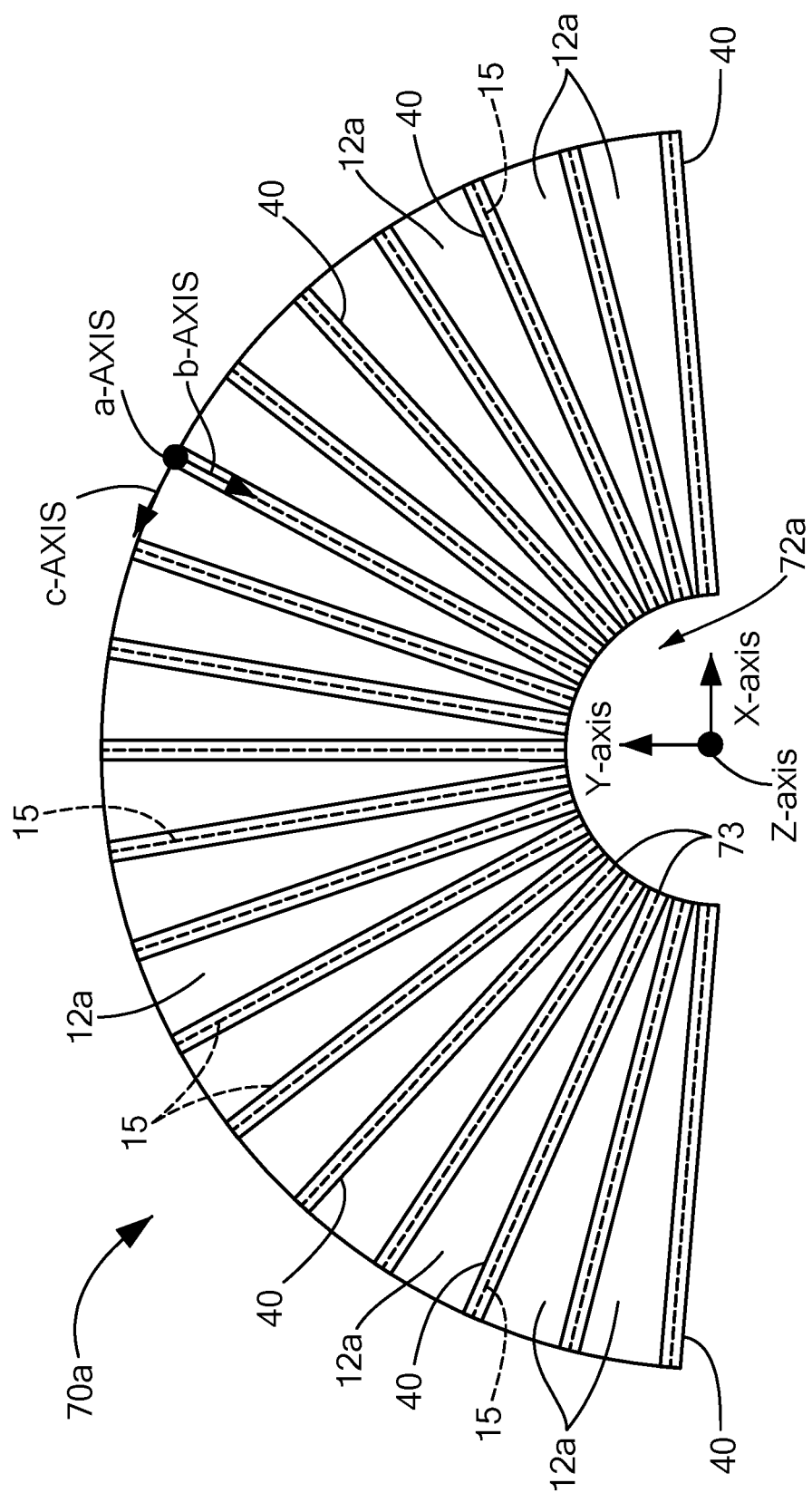
FIGS. 7A-7D are a series of sketches showing a method for fabrication an anisotropic thermal conduit in accordance with the disclosure.
Figure 7B:
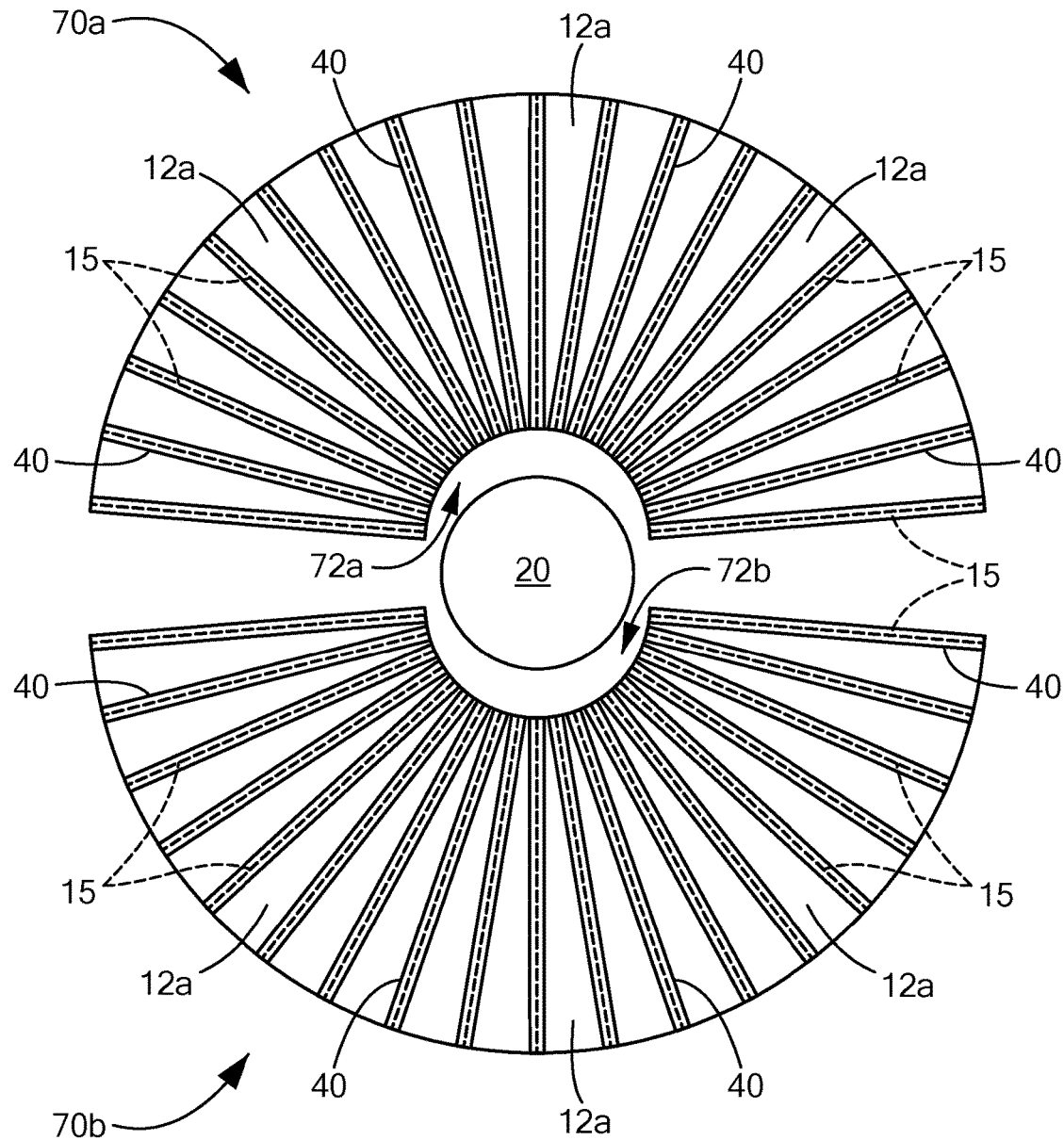

Referring now to FIG. 7B, a second structure 70b like structure 70a is formed; likewise forming a semi-circular region 72b. The inner tube or rod 20 is aligned with a hole formed by the semi-circular regions 72a, 72b, as shown and the aligned inner tube or rod 20, and structure 70a, 70b are bonded together and to the inner tube or rod 20 with a reactive metal braze alloy 32 as shown in a manner to form structure 74, as shown in FIG. 7D.

Figure 7C:
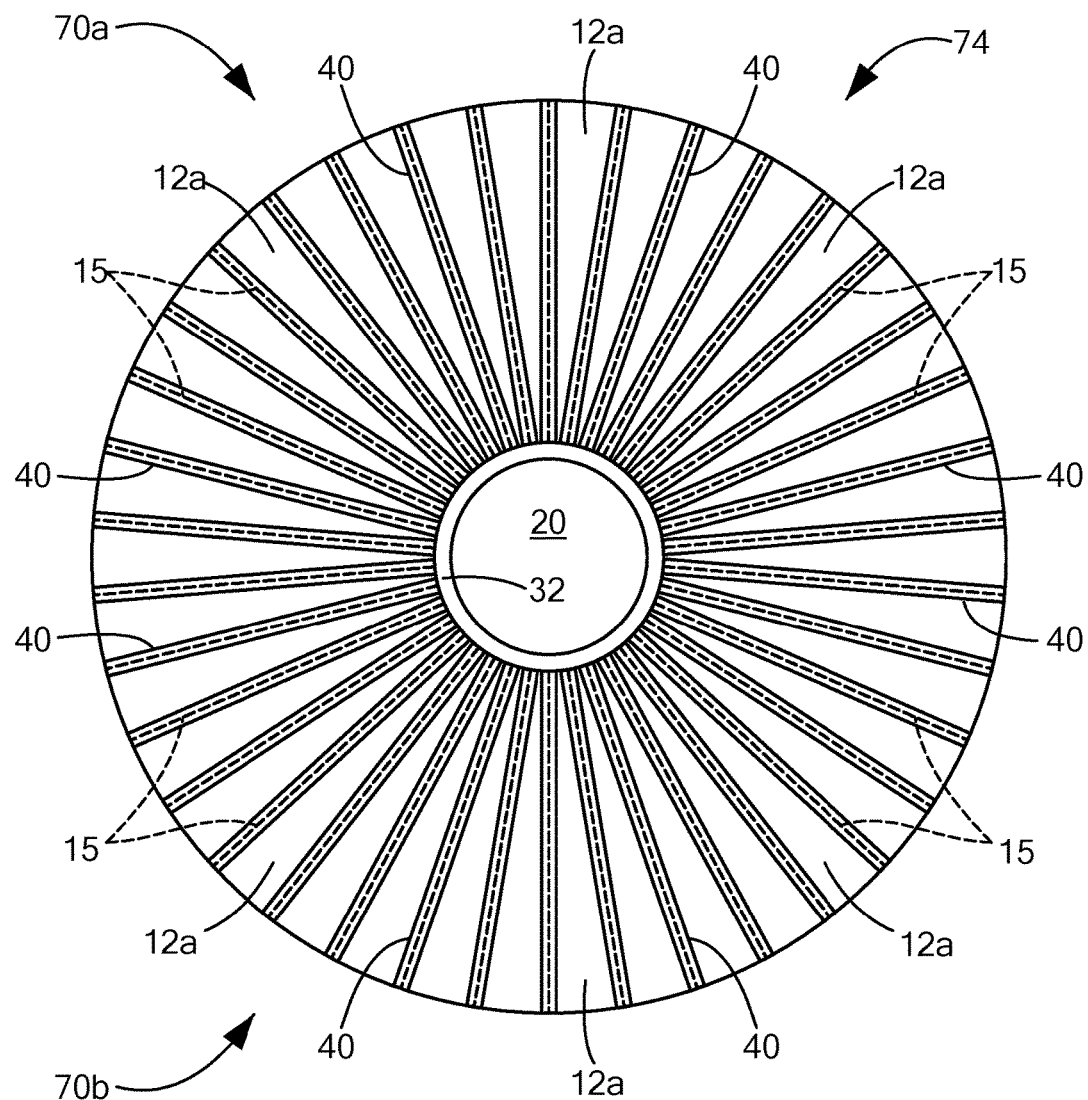
Figure 7D:
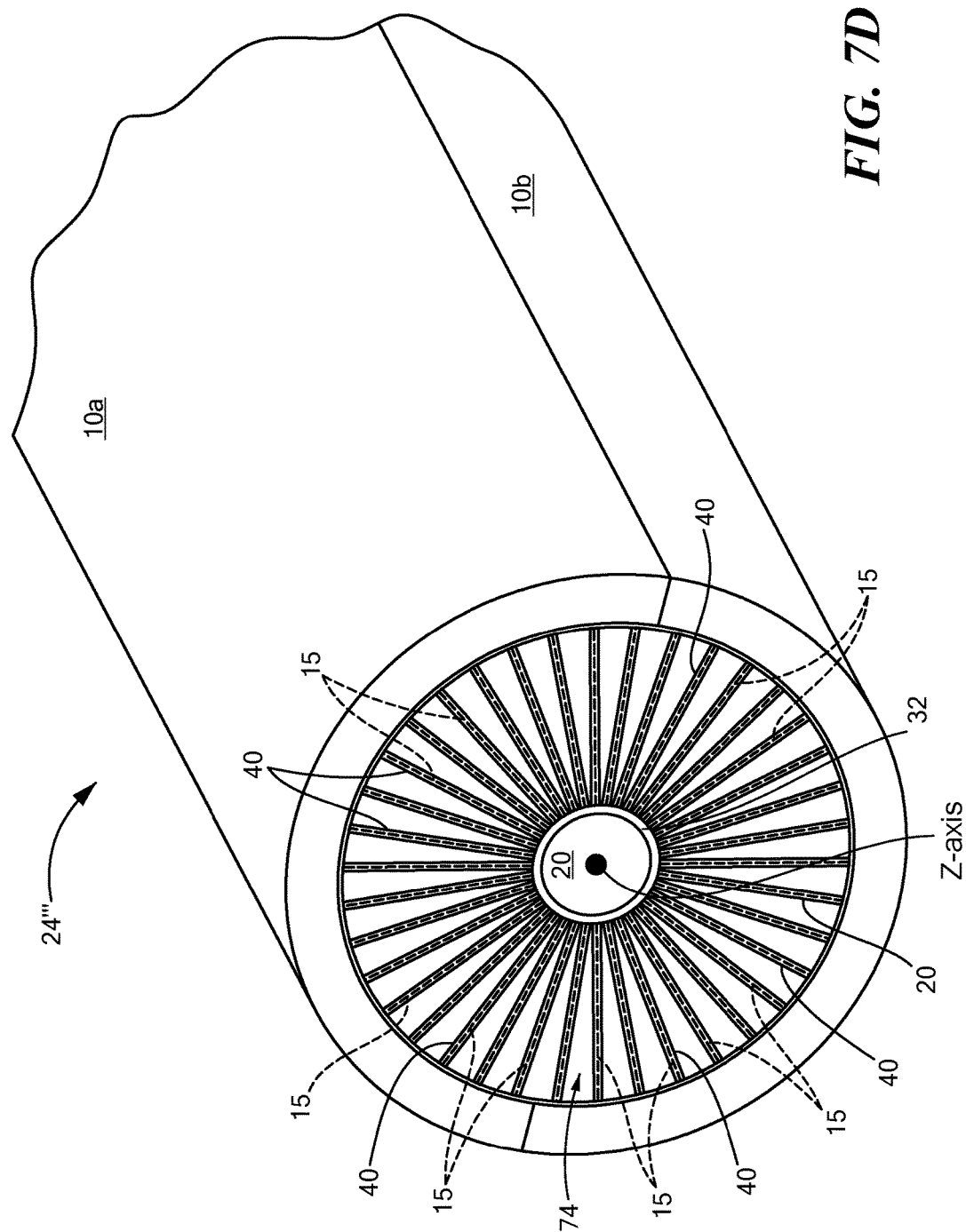
Figure 8:
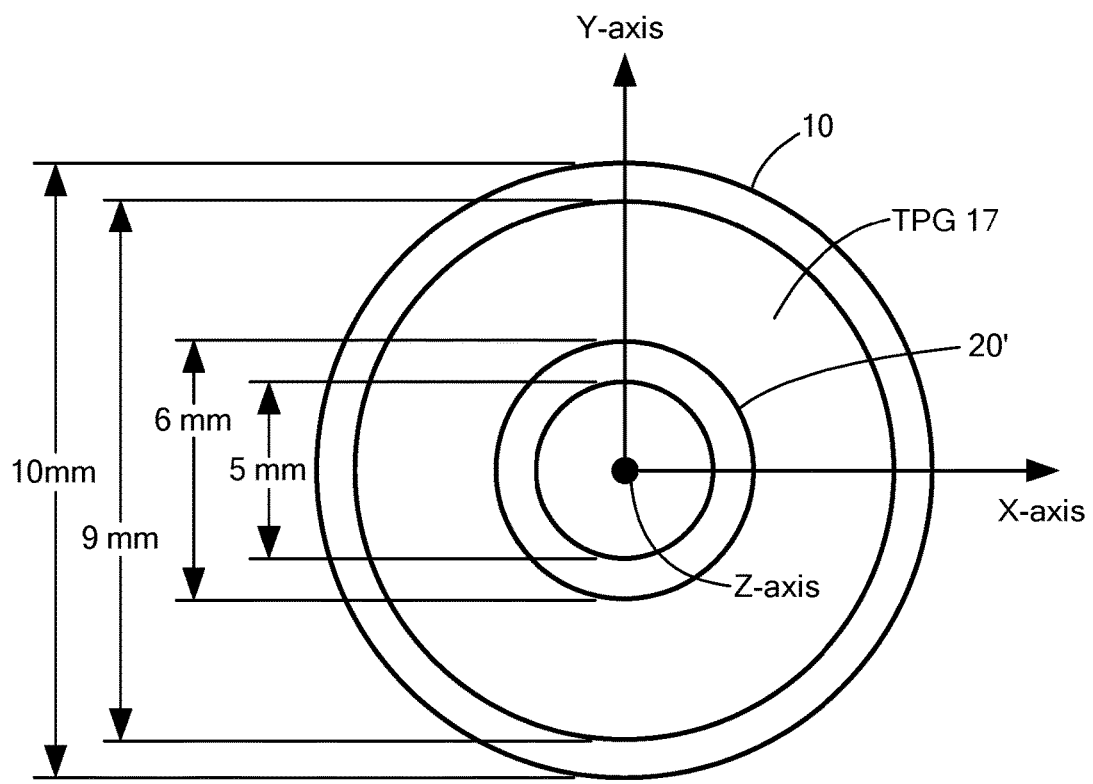
FIG. 8 is an end view of a thermally conductive conduit that was used in a model to calculate thermal conductivity of the embodiments shown in FIGS. 2D, 5F, 6I, and 7D.

Referring now to FIG. 7C, the formed structure 74 is bonded to the inner walls 11a, 11b of tube sections 10a, 10b, respectively (FIG. 2B) in a manner described in connection with FIGS. 5D and 5E to produce the anisotropic thermal conduit 24''', shown in FIG. 7D. Here, the thermal conductivity of the anisotropic thermal material conducts heat radially outwardly from the longitudinal axis of the tube.

and are referenced to the tube 10, the Z-axis being aligned with the longitudinal axis, Z of the tube; whereas the a-AXIS, b-AXIS and c-axis are referenced to the anisotropic material 17 as described above in connection with FIG. 3A. A model used for the thermal conductivity calculation is shown in FIG. 8 exemplifies the four configurations (i.e., tubes 24, 24', 24" and 24'''). It was assumed that the inner tube or rod 20 was here a tube 20' and that: it and the outer tube 10 were made of copper; the inner diameter of the tube 20' was 5 mm, as shown; the outer diameter of the outer tube 10 was 10 mm, the thickness of each of the inner and outer tube 10, 20' was 0.5 mm, and the radial thickness of the TPG layer 17 used in the entire completed tube, (24, 24', 24" or 24''') was 1.5 mm, as shown in the diagram, in FIG. 8. The thermal conductivity of the copper of the inner tube 20' and the outer tube 10 was 400 W/m-° K. The thermal conductivity of the TPG was 1500 W/m-° K in basal plane and 10 W/m-° K perpendicular to the basal plane. Calculated thermal conductivity values neglect the thin reactive metal braze alloy layers.

TABLE

| Thermal Conductivity, K | THERMAL ANISOTROPIC CONDUIT 24 | THERMAL ANISOTROPIC CONDUIT 24' | THERMAL ANISOTROPIC CONDUIT 24" | THERMAL ANISOTROPIC CONDUIT 24''' |
|---|---|---|---|---|
| $K_x$ (W/m-° K) (from the outer edge of tube 10 the inner edge of tube 20' along the X-axis. FIG. 8.) | 714 | 16 | 714 | 714 |
| $K_y$ (W/m-° K) (from the outer edge of tube 10 to the inner edge of tube 20' along the Y-axis. FIG. 8.) | 16 | 16 | 714 | 714 |
| $K_z$ (W/m-° K) (from a front flat face of the conduit 24 (a face of the conduit 24 in the X-Y plane) to an opposite flat face of the conduit 24 (a face of the conduit 24 in the X-Y plane) along the length of conduit 24; that is along the Z-axis. FIG. 8.) | 1060 | 1060 | 166 | 1060 |
| THERMAL CONDUCTION DIRECTION | Along the X-axis and the Z-axis (The basal plane of the TPG is in the X-Z plane of the tube 20) | Along the Z-axis | Along the X-axis and the Y-axis | Along the X-axis, the Y-axis, and the Z-axis (radially outward from the longitudinal axis, Z) |
| THERMAL INSULATION DIRECTION | Along the Y-axis | Along the X-axis and the Y-axis | Along the Z-axis | NOT APPLICABLE |

Thermal conductivity, measured in watts per meter degree kelvin (W/m-° K) of the four thermal anisotropic conduits 24, 24', 24" and 24''' were calculated with results provided in the TABLE below. It should be understood that the X-axis, Y-axis, and Z-axis are mutually perpendicular axis By creation of the anisotropic thermal tubular conduit 24 (FIG. 2D), performance can be enhanced due to the opportunity to reduce the number of transitions from the heat source to the heat sink (FIG. 4). Due to the anisotropic nature of the TPG, the heat flow can be controlled in multiple ways as shown in the examples above. The heat may be directed radially along the plane perpendicular to the longitudinal axis Z-axis) as in conduit 24″ and 24‴ or primarily along the plane parallel to the Z axis, as in conduit 24 and 24′ providing design flexibility and opportunity for additional system benefits.

A number of embodiments of the disclosure have been described. Nevertheless, it will be understood that various modifications may be made without departing from the spirit and scope of the disclosure. For example, with rod 20 a hollow tube, a coolant may be passed through such a hollow tube. Further, while here the tube 10 and the rod 20 have a common central axis, here designated as the Z-axis, the central axis of the rod 20 may be laterally offset from the central axis of the tube 20. Still further, the material used to form the various embodiments of the conduit may be flexible to provide bendable conduits. Also, the tube 10 may have a curved longitudinal axis, Z. Additionally it should be noted that reactive metals such as titanium or vanadium may be mixed in as reactive braze filler or deposited on the surfaces to be braze. Alternate bonding materials may be used. Accordingly, other embodiments are within the scope of the following claims.

What is claimed is:

1. An anisotropic thermal conduit comprising: an outer structure; and an anisotropic thermal material disposed within, and thermally coupled to, the outer structure.

2. The anisotropic thermal conduit of claim 1 wherein the anisotropic thermal material has a greater thermal conductivity along a longitudinal axis of the outer structure than the thermal conductivity of the anisotropic thermal material along a direction perpendicular to the longitudinal axis of the outer structure.

3. The anisotropic thermal conduit of claim 1 wherein the anisotropic thermal material has a smaller thermal conductivity along a longitudinal axis of the outer structure than the thermal conductivity of the anisotropic thermal material along a direction perpendicular to the longitudinal axis of the outer structure.

4. The anisotropic thermal conduit of claim 1 wherein the anisotropic thermal material has a smaller thermal conductivity along a direction circumferentially within the outer structure than the thermal conductivity of the anisotropic thermal material along a direction along the longitudinal axis of the outer structure.

5. The anisotropic thermal conduit of claim 1 wherein the anisotropic thermal material is embedded with the outer structure.

6. The anisotropic thermal conduit of claim 1 wherein the outer structure is a thermally conductive metal.

7. The anisotropic thermal conduit of claim 1 including an inner rod disposed within the outer structure and wherein the anisotropic thermal material is disposed between the inner or rod and the outer structure.

8. The anisotropic thermal conduit of claim 1 wherein the outer structure has a circular cross-section.

9. The anisotropic thermal conduit of claim 7 wherein the inner rod or has a circular cross-section.

10. The anisotropic thermal conduit of claim 1 wherein the outer structure is a metal.

11. The anisotropic thermal conduit of claim 1 wherein the outer structure is MoCu, WCu, W, Mo, Cu.

12. The anisotropic thermal conduit of claim 7 wherein the inner rod is a metal, a ceramic, glass or a plastic.

13. The anisotropic thermal conduit recited in claim 1 wherein the thermal conductivity of the anisotropic thermal material conducts heat radially outwardly from the longitudinal axis of the structure.

14. The anisotropic thermal conduit recited in claim 1 wherein the anisotropic thermal material has a basal plane perpendicular to the longitudinal axis of the outer structure.

15. The anisotropic thermal conduit recited in claim 1 wherein the anisotropic thermal material has a basal plane parallel of a longitudinal axis of the outer structure.

16. The anisotropic thermal conduit recited in claim 1 wherein the anisotropic thermal material has a basal plane perpendicular extending radially outwardly from a longitudinal axis of the outer structure.

17. The heat transfer system recited in claim 1 wherein the anisotropic thermal material has a basal plane, an outer edge of the basal plane being in contact with the outer structure.

18. The heat transfer system recited in claim 1 wherein the anisotropic thermal material has a basal plane extending radially outward from an inner region of the outer structure.

19. The heat transfer system recited in claim 1 wherein the anisotropic thermal material comprises a plurality of sheets of anisotropic thermal material, edges of the sheets extending radially outwardly from an inner region of the outer structure, outer edge of the sheets being thermally coupled to the outer structure, a surface of one of the sheets being thermally coupled a surface of an adjacent one of the sheets.

20. The heat transfer system recited in claim 1 wherein the anisotropic thermal material has a basal plane perpendicular to a longitudinal axis of the outer structure.

21. The heat transfer system recited in claim 1 wherein the anisotropic thermal material comprises a plurality of sheets of anisotropic thermal material, each one of the a plurality of sheets having a basal plane therein, the basal plane of each one of the sheets being disposed around a longitudinal axis of the outer structure, the plurality of sheets being disposed successively outwardly from the longitudinal axis of the outer structure, the sheets being thermally coupled one to another, an outer one of the sheets being thermally coupled to the outer structure.

22. The heat transfer system recited in claim 1 wherein the anisotropic thermal material has a basal plane parallel to a longitudinal axis of the outer structure.

23. A heat transfer system, comprising:
    a heat source;
    a heat sink;
    an anisotropic thermal conduit interposed between the heat source and the heat sink to transfer heat from the heat source to the heat sink, the anisotropic thermal conduit comprising: an outer structure; and an anisotropic thermal material having a basal plane, the anisotropic thermal material being disposed within, and thermally coupled to, the outer structure;
    wherein the heat source and the heat sink are disposed externally of, and thermally coupled to, the outer structure; and
    wherein one portion of the basal plane is thermally coupled to the heat source and another portion of the basal plane is thermally coupled to the heat sink to conduct heat from the heat source to the heat sink through the basal plane.

24. The heat transfer system recited in claim 23 wherein the basal plane is in direct contact with the heat source and the heat sink.

25. A method for transferring heat from a heat source to a heat sink, comprising:

providing a anisotropic thermal conduit comprising: an outer structure; and an anisotropic thermal material disposed with, and thermally coupled to, the outer structure, the heat source and the heat sunk being disposed externally of, and thermally coupled to, the outer structure, the anisotropic thermal material having an opening passing therethrough; and passing a coolant through the opening.

\* \* \* \* \*